(12) United States Patent
Ling et al.

(10) Patent No.: US 9,576,614 B2
(45) Date of Patent: Feb. 21, 2017

(54) METHOD AND APPARATUS FOR MEMORY POWER AND/OR AREA REDUCTION

(71) Applicant: MaxLinear, Inc., Carlsbad, CA (US)

(72) Inventors: Curtis Ling, Carlsbad, CA (US); Vadim Smolyakov, Mississauga, CA (US); Timothy Gallagher, Encinitas, CA (US); Glenn Gulak, Toronto, CA (US)

(73) Assignee: MAXLINEAR, INC., Carlsbad, CA (US)

( * ) Notice: Subject to any disclaimer, the term of this patent is extended or adjusted under 35 U.S.C. 154(b) by 26 days.

(21) Appl. No.: 14/450,324

(22) Filed: Aug. 4, 2014

(65) Prior Publication Data
US 2015/0023122 A1   Jan. 22, 2015

Related U.S. Application Data

(63) Continuation of application No. 13/285,945, filed on Oct. 31, 2011, now Pat. No. 8,797,813.
(Continued)

(51) Int. Cl.
*G11C 5/14* (2006.01)
*G11C 29/02* (2006.01)
(Continued)

(52) U.S. Cl.
CPC ............ *G11C 5/14* (2013.01); *G06F 11/1048* (2013.01); *G11C 29/021* (2013.01); *G11C 29/028* (2013.01); *G11C 2029/0409* (2013.01)

(58) Field of Classification Search
CPC ....... G11C 5/14; G11C 29/021; G11C 29/028; G06F 11/1048
(Continued)

(56) References Cited

U.S. PATENT DOCUMENTS 4,506,364 A   3/1985   Aichelmann, Jr. et al.
4,817,056 A   3/1989   Furutani
(Continued)

FOREIGN PATENT DOCUMENTS

CN   1662997 A   8/2005
CN   101901170 A   12/2010
GB   2442846 A   4/2008

OTHER PUBLICATIONS

European Search Report for PCT/US2012/023977 dated Dec. 1, 2014.
(Continued)

*Primary Examiner* — Toan Le
(74) *Attorney, Agent, or Firm* — McAndrews, Held & Malloy, Ltd.

(57) ABSTRACT

A method and apparatus for memory power and/or area reduction. An array of memory cells may be scanned to detect faulty memory cells, if any, in the array. A supply voltage $V_{mem}$ applied to the array of memory cells may be controlled based on a result of the scan, and based on a sensitivity coefficient of one, or more, of the array of memory cells. The sensitivity coefficient may indicate an impact that the one, or more, of the array of memory cells being faulty may have on the performance of a device that reads and writes data to the memory array. Additionally or alternatively, the physical dimensions of the memory cells may be determined based on the sensitivity coefficient(s) and/or based on a number of faulty memory cells that can be tolerated in the array of memory cells.

82 Claims, 19 Drawing Sheets

Related U.S. Application Data

(60) Provisional application No. 61/487,250, filed on May 17, 2011.

(51) Int. Cl.
*G06F 11/10* (2006.01)
*G11C 29/04* (2006.01)

(58) Field of Classification Search
USPC ........ 365/201, 200, 227; 714/710, 718, 755, 714/763
See application file for complete search history.

(56) References Cited

U.S. PATENT DOCUMENTS

| | | | |
|---|---|---|---|
| 5,233,614 | A | 8/1993 | Singh |
| 5,805,604 | A | 9/1998 | Nishikawa |
| 5,892,775 | A | 4/1999 | Jayant et al. |
| 5,909,404 | A | 6/1999 | Schwarz |
| 6,108,353 | A | 8/2000 | Nakamura |
| 7,023,719 | B1 | 4/2006 | Hung |
| 7,266,747 | B2 | 9/2007 | Foss |
| 2003/0182491 | A1 | 9/2003 | Chudnovsky et al. |
| 2004/0117723 | A1 | 6/2004 | Foss |
| 2005/0240814 | A1* | 10/2005 | Sasakura ............ G01R 31/3004 714/14 |
| 2006/0280019 | A1 | 12/2006 | Burton |
| 2007/0016337 | A1* | 1/2007 | Iwagami ................ B60R 16/03 701/1 |
| 2008/0082899 | A1* | 4/2008 | Muhammad ........ G11C 11/4125 714/763 |
| 2008/0091990 | A1 | 4/2008 | Bruce |
| 2008/0181015 | A1 | 7/2008 | Lee |
| 2010/0070830 | A1 | 3/2010 | Ngo |
| 2010/0115376 | A1 | 5/2010 | Shalvi et al. |
| 2010/0128541 | A1 | 5/2010 | Russell |
| 2010/0220538 | A1 | 9/2010 | Chen |
| 2010/0246297 | A1 | 9/2010 | Zhang et al. |
| 2010/0246298 | A1 | 9/2010 | Zhang |
| 2010/0306620 | A1 | 12/2010 | Spraul |

OTHER PUBLICATIONS

Chinese Search Report for Application No. 201280031645.0.
Int'l Search Report and Written Opinion for PCT/US2012/023977 dated May 23, 2012.
Int'l Search Report and Written Opinion for PCT/US2012/023975 dated May 23, 2012.
Saibal Mukopadhyay, et al., Statistical Design and Optimization of SRAM Cell Yield Enhancement, Dept. of Elec. and Computer Engin., Purdue Univ., West LaFayette, IN 2004, IEEE< pp. 10-13.

\* cited by examiner

METHOD AND APPARATUS FOR MEMORY POWER AND/OR AREA REDUCTION

CLAIM OF PRIORITY

This patent application is a continuation of U.S. application Ser. No. 13/285,945, filed Oct. 31, 2011, now patented as U.S. Pat. No. 8,797,813, which also makes reference to, claims priority to and claims benefit from U.S. Provisional Patent Application Ser. No. 61/487,250 filed on May 17, 2011.

The above application is hereby incorporated herein by reference in its entirety.

INCORPORATION BY REFERENCE

This patent application also makes reference to:
U.S. patent application Ser. No. 13/269,416 filed on Oct. 7, 2011; and
U.S. patent application Ser. No. 13/285,864 filed on even date herewith.

Each of the above-referenced applications is hereby incorporated herein by reference in its entirety.

FIELD OF THE INVENTION

Certain embodiments of the invention relate to memory circuits. More specifically, certain embodiments of the invention relate to a method and apparatus for memory power and/or area reduction.

BACKGROUND OF THE INVENTION

Conventional memory circuits occupy large areas and consume significant amount of power. Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

An apparatus and/or method is provided for memory power and/or area reduction, substantially as illustrated by and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

As utilized herein the terms "circuits" and "circuitry" refer to physical electronic components (i.e. hardware) and any software and/or firmware ("code") which may configure the hardware, be executed by the hardware, and/or otherwise be associated with the hardware. As utilized herein, "and/or" means any one or more of the items in the list joined by "and/or." For example, "x and/or y" means any element of the three-element set {(x), (y), (x, y)}. Similarly, "x, y, and/or z" means any element of the seven-element set {(x), (y), (z), (x, y), (x, z), (y, z), (x, y, z)}. As utilized herein, the term "module" refer to functions than can be implemented in hardware, software, firmware, or any combination of one or more thereof. As utilized herein, the term "exemplary" means a non-limiting example, instance, or illustration. As utilized herein, the terms "e.g." and "for example" introduce a list of one or more non-limiting examples, instances, or illustrations.

Figure 1A:
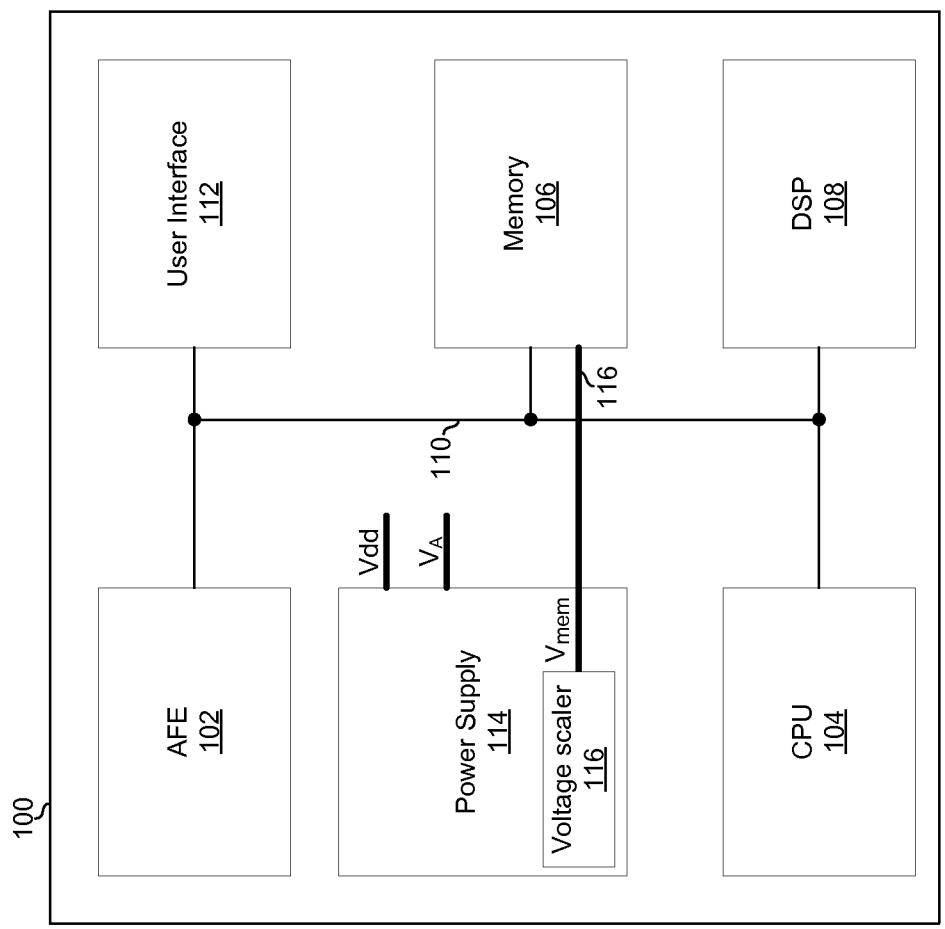
FIG. 1A depicts an exemplary device operable to mitigate the impact of faulty memory cells.

FIG. 1A depicts an exemplary device operable to mitigate the impact of faulty memory cells. Referring to FIG. 1A, there is shown circuitry of an exemplary electronic device 100 which comprises an analog front-end (AFE) module 102, a central processing unit (CPU) 104, a memory module 106, a digital signal processing module (DSP) 108, a user interface module 112, a signal bus 110, a power supply module 114, and a power rail 116. Some examples of a device 100 include a cable or satellite set-top-box or gateway, a television, an optical disk player, a digital video recorder, and a mobile phone.

The AFE 102 may be operable to transmit and/or receive information utilizing any suitable communication protocol(s). In an exemplary embodiment of the invention, the AFE 102 may be operable to perform analog-domain processing operations that enable transmission and/or reception of orthogonal frequency division multiplexed (OFDM) signals.

The CPU 104 may be operable to execute instructions (e.g., an operating system) to control operations of the device 100. For example, the CPU 104 may generate control signals for configuring the device 100, and controlling operation of the AFE 102, the memory 106, and the DSP 108.

The power supply 114 may be operable to generate one or more supply voltages, and output them to other components of the device 100 via one or more lines ("power rails"). The power supply 114 may generate a voltage, $V_{mem}$, which may be output on the power rail 116. The voltage scaler 116 may be controlled (e.g., via a control signal from the CPU 104) such that $V_{mem}$ may be configurable among a plurality of voltages. The power supply 114 may also generate other supply voltages (in the exemplary embodiment shown, the power supply 114 generates Vdd for digital circuitry and $V_A$ for analog circuitry of the AFE 102). The value of $V_{mem}$ may be controlled independent of other voltages generated by the power supply 114. In another embodiment of the invention, the power supply 114 may generate multiple memory supply voltages (e.g., $V_{mem1}$ and $V_{mem2}$). The value of each of the memory supply voltages may be configured independently and/or the values of the multiple memory supply voltages may be configured in unison.

The memory 106 may comprise a plurality of memory cells which may be arranged into one or more rows and one or more columns. The memory may comprise any suitable type of volatile and/or non-volatile memory such as SRAM, DRAM, ROM, EEPROM, MRAM, FeRAM, and flash. Memory cells of the memory 106 may be powered by the voltage $V_{mem}$ received via the rail 116. In an exemplary embodiment of the invention, circuitry of the memory 108 other than the memory cells themselves may be powered via a different power rail (not shown). An exemplary structure of the memory 106 is described below with respect to FIGS. 2-3B.

The DSP 108 may be operable to perform digital signal processing algorithms and functions in accordance with one or more communication standards. For example, the DSP 108 may be operable to perform digital filtering, constellation mapping, constellation demapping, interleaving, deinterleaving, and error correction. In an exemplary embodiment of the invention, the DSP 108 may be operable to perform digital-domain processing functions that enable transmission and/or reception of orthogonal frequency division multiplexed (OFDM) signals.

The bus 110 may comprise data lines, address lines, and/or control lines. For example, the signal bus 110 may comprise one or more N-bit data busses, and a plurality of control lines such as read enable and write enable signals conveyed to the memory 106.

The user interface 112 may receive input from a user of the device 100 and provide output to the user of the device 100. For example, the user interface 112 may comprise a touchscreen, keyboard, and/or other input device, and may comprise an LCD, speakers, and/or other output device.

In an exemplary receive operation, the AFE 102 may receive an RF signal, process the received signal in the analog domain to generate a baseband signal, digitize the baseband signal, and output the baseband signal to the DSP 108 via the signal bus 110. The DSP 108 may process the baseband signal to recover information contained in the baseband signal. During processing of the baseband signal, the DSP 108 may read and write to the memory 106. The recovered information may then be conveyed to the user interface 112 for output to a user of the device.

In an exemplary transmit operation, data to be transmitted may be read from memory 106 and conveyed to the DSP 108. The DSP 108 may process the data to generate a baseband signal in accordance with one or more communication standards. In generating the baseband signal, the DSP 108 may read from and write to the memory 106. The generated baseband signal may be conveyed to the AFE 102 where it may be converted to an analog representation, further processed, and transmitted onto a physical medium.

Figure 1B:
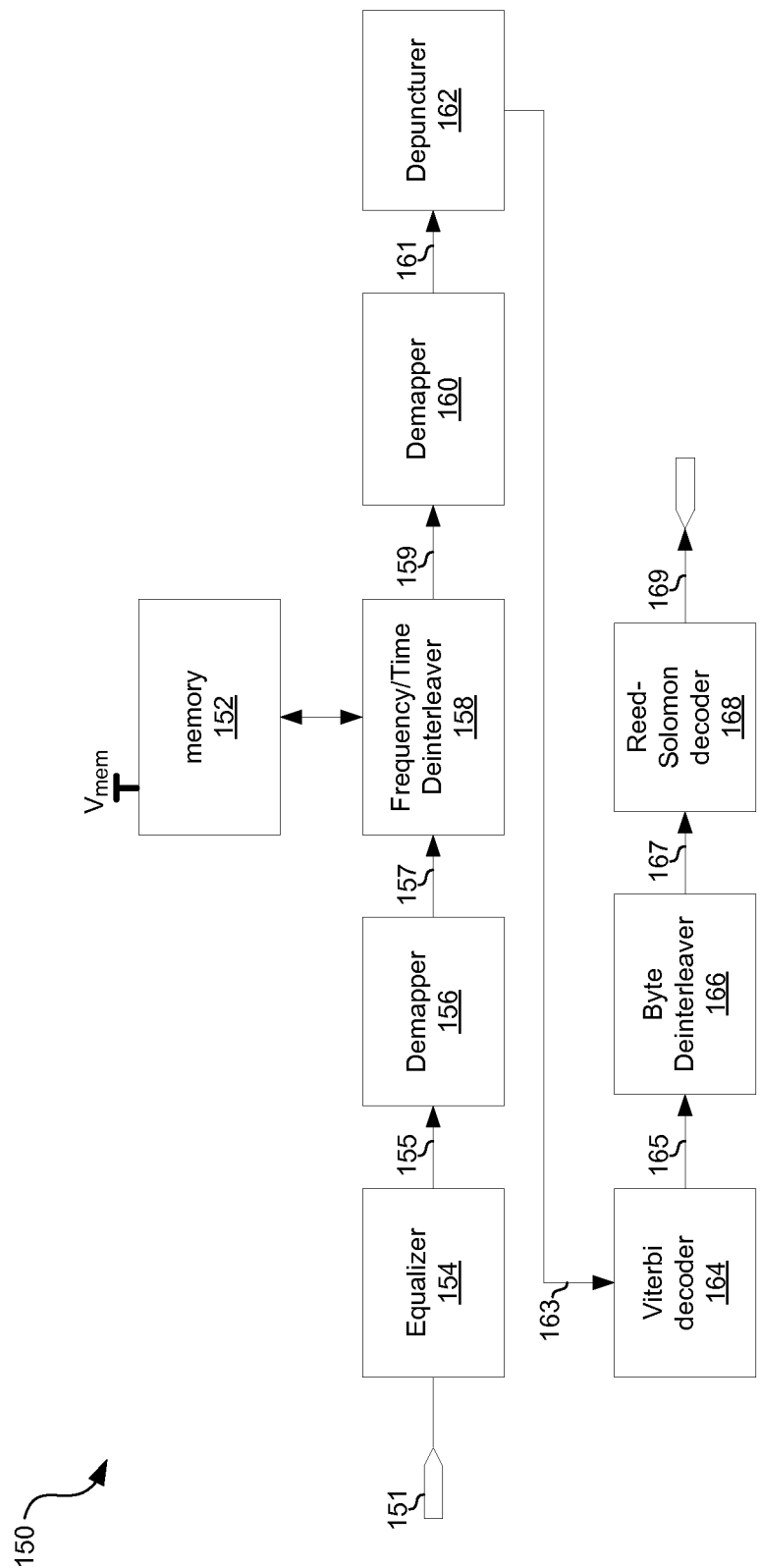
FIG. 1B depicts a portion of an exemplary receiver which, through use of the present invention, can achieve satisfactory performance even when utilizing an array of memory cells that has more than a correctable number of faulty memory cells.

FIG. 1B depicts a portion of an exemplary receiver which, through use of the present invention, can achieve satisfactory performance even when utilizing an array of memory cells that has more than a correctable number of faulty memory cells.

Figure 2:
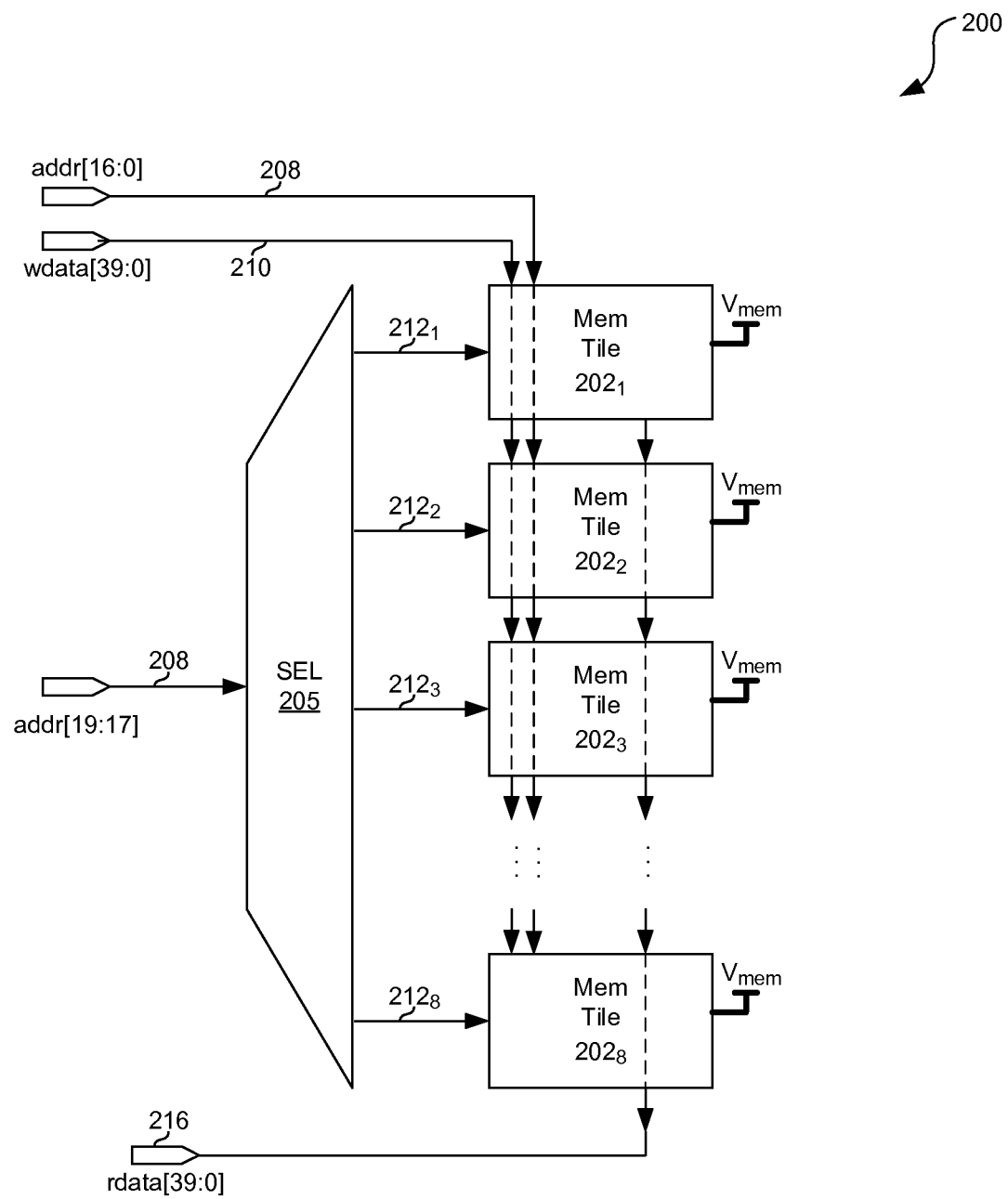
FIG. 2 depicts a first view of an exemplary fault-tolerant memory.

As utilized herein, an "array" of memory cells may refer to a group of memory cells corresponding to a particular address (e.g., a particular value on the address bus 208 of FIG. 2). Thus, for example, the memory 200 of FIG. 2 may be referred to as "array-addressable." For example, if the memory 200 utilized 8-bit arrays, it may be referred to as byte-addressable. Similarly, if the memory 200 utilized X-bit arrays (X being an integer), with each array corresponding to an X-bit word of memory, the memory 200 may be referred to as word-addressable.

The depicted portion of the receiver 150 comprises a memory module 152, an equalizer module 154, demapper modules 156 and 160, deinterleaver module 158, depuncturer module 162, Viterbi decoder module 164, byte deinterleaver module 166, Reed-Solomon decoder module 168. The depicted portion of the receiver 150 may be implemented by, for example, a DSP such as the DSP 108 of FIG. 1A.

Although the memory module 152 is depicted as being utilized by only the deinterleaver module 158, other modules of the receiver 150 may also read and/or write to the memory module 152 and, in doing so, may take advantage of aspects of the present invention to improve performance and/or reduce cost and/or power consumption. In addition, other modules of the receiver 150 may have their own memories that may or may not interface to the bus 110 and may comprise and/or utilize aspects of the invention.

In operation, a received digital baseband signal 151 may be received from the AFE 102. The equalizer 154 may process the signal 151 to adjust the levels of various frequency components of the signal 151 to generate the signal 155. The demapper 156 may translate symbols of the signal 155 to groups of one or more bits of the signal 157. The deinterleaver 158 may deinterleave the groups of bits of the signal 157 to generate the signal 159. The memory 152 may be utilized for buffering bits of the signal(s) 157 and/or 159 during the deinterleaving. The demapper 160 may translate groups of bits of the signal 159 to groups of bits of the signal 161. The depuncturer 162 may insert bits into the signal 161 to generate the signal 163. The Viterbi decoder 164 may decode the signal 163 utilizing the Viterbi algorithm to generate the signal 165. The byte deinterleaver 166 may rearrange the signal 165 on a byte-by-byte basis to generate the signal 167. The module 168 may perform Reed-Solomon decoding on the signal 167 to generate the signal 169. The signal 169 may be output for further processing (e.g., by a user interface).

In an exemplary embodiment of the invention, the receiver 150 may operate in a system requiring a spectral efficiency of at least 6 bits per second per Hertz. In such an embodiment, aspects of the present invention may enable the receiver to tolerate a cell failure rate of at least 0.0004 for any given column of the memory 152 without degrading the carrier-to-noise sensitivity threshold by more than 0.025 dB. This may be accomplished even though the memory 152 may be smaller in area than conventional memories based on foundry-standard cells. The memory 152 may be made smaller by, for example, reducing the number of, or completely eliminating, redundant columns and/or redundant rows of memory cells.

In an exemplary embodiment of the invention, the value of $V_{mem}$ supplied to the memory 152 may be configured to achieve a desired balance between power consumption of the memory 152 and the number of faulty memory cells in the memory 152. In this regard, as $V_{mem}$ is reduced, power consumption of the memory 152 may decrease while the number of faulty memory cells may increase. Accordingly, during a calibration of the memory 106, $V_{mem}$ may be decreased from a maximum value to a lower value which still results in an acceptable number of faulty memory cells in the memory 152 for a given application.

FIG. 2 depicts a first view of an exemplary fault-tolerant memory. Referring to FIG. 2, the memory 200 comprises a selector 205, and a plurality of memory tiles $202_1$-$202_8$. Other exemplary memories may comprise a different number of memory tiles. Also shown is an address bus 208, a write data bus 210, and a read data bus 216, and tile select lines $212_1$-$212_8$. In the exemplary memory depicted in FIG. 2, the write data bus 210 and the read data bus 216 each comprise 40 lines for carrying 40-bits of data, and the address bus 208 comprises 20 lines for carrying a 20-bit address. Although a 20-bit address and 40-bit data is depicted, the invention is not limited to any particular number of address or data bits.

Figure 3A:
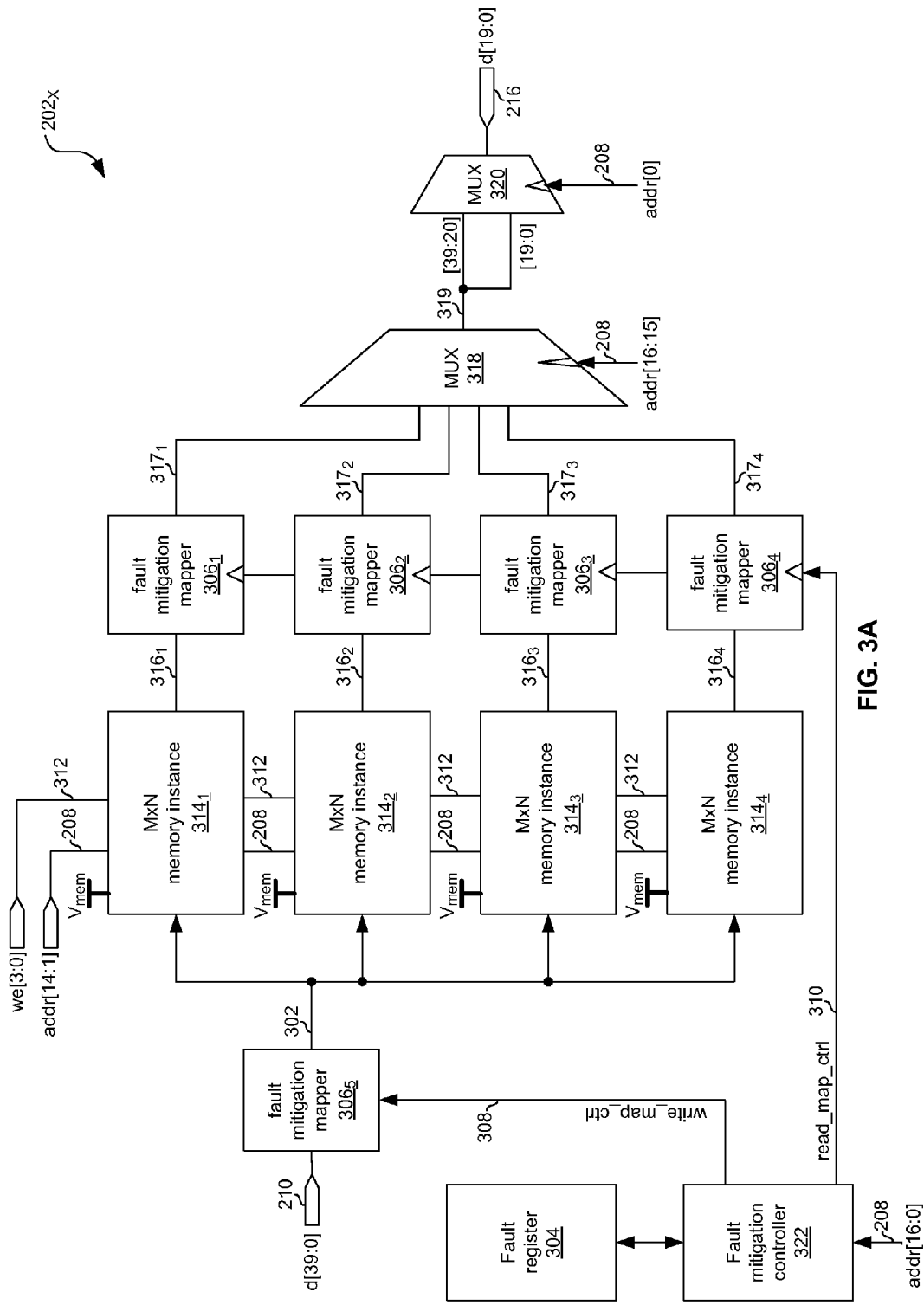
FIG. 3A depicts a second view of an exemplary fault-tolerant memory.

The memory tiles $202_1$-$202_8$ may comprise one or more arrays of memory cells and associated peripheral components. Each array may reside entirely in one of the memory tiles $202_1$-$202_8$, or may span multiple ones of the memory tiles $202_1$-$202_8$. An exemplary memory tile $202_X$, where X is an integer between 1 and 8, inclusive, is depicted in FIG. 3A. The selector 205 may decode the value on the three most significant lines of the address bus 208 (corresponding to the three most significant bits (MSBs) of the address) to assert one of the tile select signals $212_1$-$212_8$.

In an exemplary write operation, the address of a memory location to which data is to be written may be placed on the address bus 208, and data to be written to the memory location may be placed on the write data bus 210. The three most-significant lines of the address bus 208 may determine which one of the tile select lines $212_1$-$212_8$ is asserted. The asserted tile select line $212_X$ may result in the tile $202_X$ being selected. The seventeen least significant lines of the address bus 208 (corresponding to the seventeen least significant bits (LSBs) of the address) may determine to which memory location in the selected tile $202_X$ the data on the write data bus 210 is written.

In an exemplary read operation, the address of a memory location from which data is to be read may be placed on the address bus 208. The three MSBs of the address may determine which one of the tile select lines $212_1$-$212_8$ is asserted. The asserted tile select line $212_X$ may result in the tile $202_X$ being selected. The seventeen least significant lines of the address bus 208 may determine which memory location in the selected tile $202_X$ is read out onto the read data bus 216.

FIG. 3A depicts a second view of an exemplary fault-tolerant memory. Shown in FIG. 3A is an exemplary memory tile $202_X$ which may correspond to one of the memory tiles $202_1$-$202_8$ in FIG. 2. The memory tile $202_X$ comprises fault register 304, fault mitigation mapping modules $306_1$-$306_5$, fault mitigation control module 322, memory instances $314_1$-$314_4$, and multiplexer modules 318 and 320. Also shown are a write data bus 210, a read data bus 216, a bus 302, busses $316_1$-$316_4$, write map control signal 308, and a read map control signal 310.

The fault register 304 may store the results of one or more fault scans of the memory instances $314_1$-$314_4$. Such scans may occur, for example, during start-up of the system in which the memory 200 resides (e.g., receiver 150), and/or as part of testing the memory and/or system during production. During such scan(s), the memory instances $314_1$-$314_4$ may be scanned to detect faulty memory cells. For each one or more detected faulty memory cells, one or more cells of the fault register 304 may be configured. In this manner, the fault register 304 may enable determining the number and/or location of faulty memory cells in the memory instances $314_1$-$314_4$. The fault register 304 may comprise any suitable type of volatile and/or non-volatile memory such as SRAM, DRAM, ROM, EEPROM, flash, eFuse, and/or a register consisting of one or more flip-flops internal and/or external to the memory instances $314_1$-$314_4$. For example, the fault register 304 may comprise one or more one-time-programmable cells which are programmed based on a scan performed during production and one or more SRAM cells which are programmed at each start-up. In another example, results of start-up scans may be accumulated (e.g., in flash) over multiple start-ups. Memory cells of the fault register may be physically separate from the memory cells of the memory instances $314_1$-$314_4$. Alternatively (or additionally), memory cells of one or more of the memory instances $314_1$-$314_4$ may be allocated to function as the fault register.

The fault mitigation control module 322 may generate the write map control signal 308 and the read map control signal 310. During a write operation, the control module 322 may control the state of the write map control signal 308 based on the array of memory cells being written to and the contents of the fault register that corresponds to that array of memory cells. During a read operation, the control module 322 may control the state of the read map control signal 310 based on the array of memory cells being read from and the contents of the fault register that corresponds to that array of memory cells.

Figure 3B:
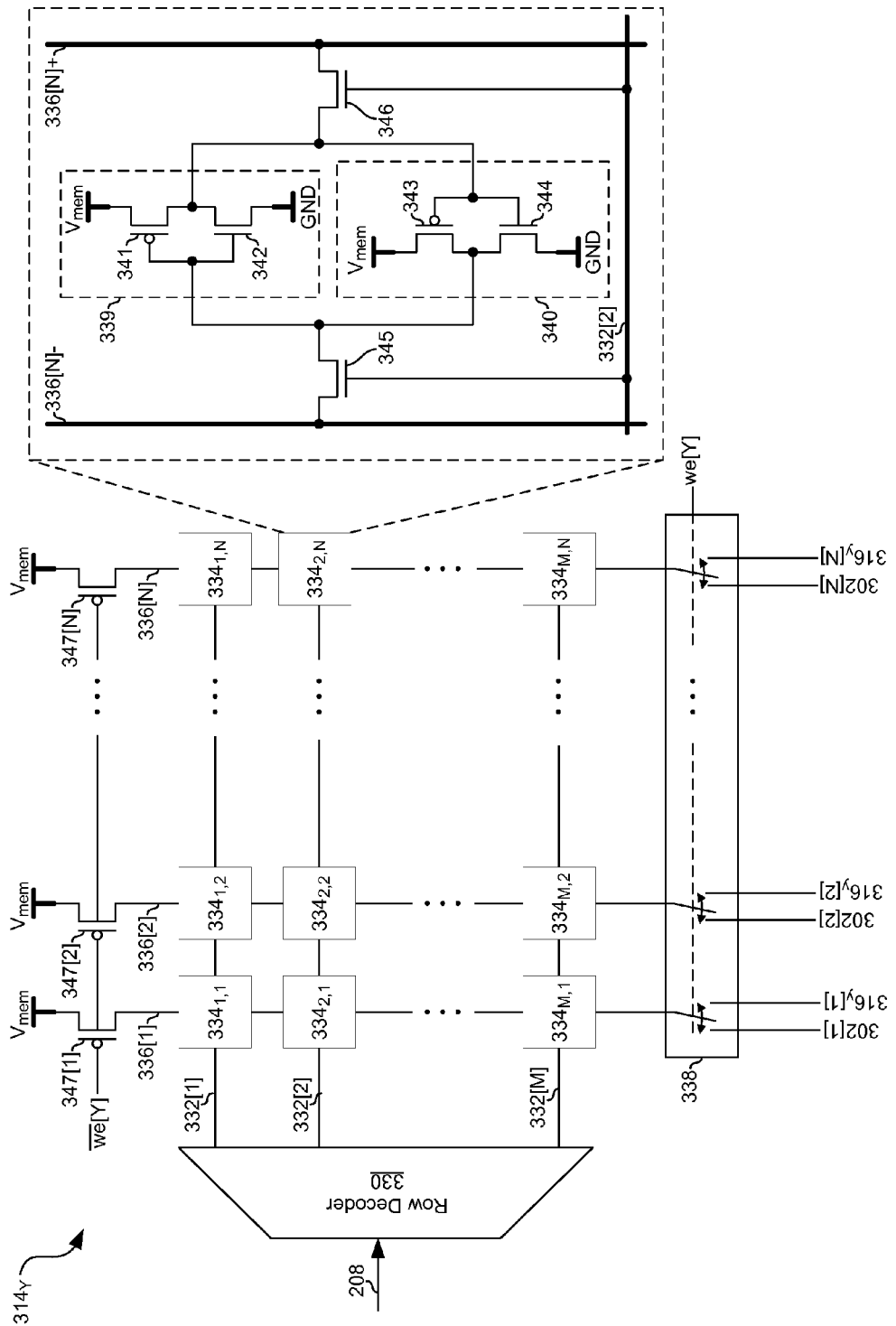
FIG. 3B depicts an exemplary memory instance.

During a read operation, the signal lines of the bus 302 may be connected, respectively, to bit lines of each of the memory instances $314_1$-$314_4$. During a write operation, the signal lines of the bus $316_1$ may be connected to the bit lines of the memory instance $314_1$, the signal lines of the bus $316_2$ may be connected to the bit lines of the memory instance $314_2$, the signal lines of the bus $316_3$ may be connected to the bit lines of the memory instance $314_3$, and the signal lines of the bus $316_4$ may be connected to the bit lines of the memory instance $314_4$. This is illustrated in FIG. 3B, which is described below.

The fault mitigation mapper $306_5$ determines which lines of the write data bus 210 connect to which lines of the bus 302. Different values of the write map control signal 308 correspond to different mappings between the lines of the write data bus 210 and the lines of the bus 302.

The fault mitigation mapper $306_1$ determines which lines of the bus $316_1$ connect to which lines of the bus $317_1$. Ultimately, if the signal $316_1$ is selected by the multiplexer 318, the fault mitigation mapper $306_1$ determines which lines of the bus $316_1$ connect to which lines of the read data bus 216. Different values of the read map control signal 310 correspond to different mappings between the bus $316_1$ and the bus $317_1$ (and thus different mappings between the bus $316_1$ and the read data bus 216).

The fault mitigation mapper $306_2$ determines which lines of the bus $316_2$ connect to which lines of the bus $317_2$. Ultimately, if the signal $316_2$ is selected by the multiplexer 318, the fault mitigation mapper $306_2$ determines which lines of the bus $316_2$ connect to which lines of the read data bus 216. Different values of the read map control signal 310 correspond to different mappings between the bus $316_2$ and the bus $317_2$ (and thus different mappings between the bus $316_2$ and the read data bus 216).

The fault mitigation mapper $306_3$ determines which lines of the bus $316_3$ connect to which lines of the bus $317_3$. Ultimately, if the signal $316_3$ is selected by the multiplexer 318, the fault mitigation mapper $306_3$ determines which lines of the bus $316_3$ connect to which lines of the read data bus 216. Different values of the read map control signal 310 correspond to different mappings between the bus $316_3$ and the bus $317_3$ (and thus different mappings between the bus $316_3$ and the read data bus 216).

The fault mitigation mapper $306_4$ determines which lines of the bus $316_4$ connect to which lines of the bus $317_4$. Ultimately, if the signal $316_4$ is selected by the multiplexer 318, the fault mitigation mapper $306_4$ determines which lines of the bus $316_4$ connect to which lines of the read data bus 216. Different values of the read map control signal 310 correspond to different mappings between the bus $316_4$ and the bus $317_4$ (and thus different mappings between the bus $316_4$ and the read data bus 216).

The memory instances $314_1$-$314_4$ may comprise one or more arrays of memory. Each array may reside entirely in one of the memory instances $314_1$-$314_4$, or may span multiple ones of the memory instances $314_1$-$314_4$. In the exemplary embodiment of the invention, each of the memory instances $314_1$-$314_4$ may comprise M*N memory cells arranged into M rows and N columns, where each of M and N is an integer, and one or both of M and N is greater than 1.

The multiplexer 318 may select which of the busses $317_1$-$317_4$ gets routed to the bus 319. The multiplexer 318 may be controlled by one or more lines of the address bus (lines 16 and 15, corresponding to address bits 15 and 16, in the exemplary embodiment depicted in FIG. 3A).

The multiplexer 320 may select which bits of the bus 319 get routed to the read data bus 216. The multiplexer 319 may be controlled by one or more lines of the address bus (line 0, corresponding to address bit 0, in the exemplary embodiment depicted in FIG. 3A).

In operation, at start-up and/or during fabrication/production testing, a scan of the memory instances $314_1$-$314_4$ may be performed and the location of faulty memory cells may be stored in the fault register 304. After the scan is complete, the memory $202_X$ may begin normal operation in which data is read from and written to the memory $202_X$, where X is an integer between 1 and 8, inclusive.

For a write operation, data to be written to a memory location may be placed on the lines of the bus 210 and the address of the location to be written to ("ADRS_W") may be placed on the address bus 208. The fault mitigation control module 322 may look up ADRS_W in the fault register 304 to determine if there are any faulty memory cells at that location in the memory instances $314_1$-$314_4$. The fault mitigation control module 322 may set the write map control signal 308 to configure the mapper $306_5$ to implement a mapping that corresponds to the results of the look-up. The data on the bus 210 may then be mapped onto the bus 302. The bit of the write enable signal 312 corresponding to memory instance $314_W$ (the memory instance corresponding to ADRS_W) may then be asserted, causing the lines of the bus 302 to be connected to bit lines of the memory instance $314_W$, and effecting the write operation.

For a read operation, the address to be read from ("ADRS_R") may be placed on the address bus 208. The fault mitigation control module 322 may look up ADRS_R in the fault register 304 to determine if there are any faulty memory cells at that location in the memory instances $314_1$-$314_4$. The fault mitigation control module 322 may set the read map control signal 310 to configure the mappers $306_1$-$306_4$ to implement a mapping that corresponds to the results of the look-up. The memory cells corresponding ADRS_R in each of the memory instances $314_1$-$314_4$ may be read out onto busses $316_1$-$316_4$, respectively. The lines of the bus $316_1$ may be mapped to the lines of the bus $317_1$ by the mapper $306_1$, the lines of the bus $316_2$ may be mapped to the lines of the bus $317_2$ by the mapper $306_2$, the lines of the bus $316_3$ may be mapped to the lines of the bus $317_3$ by the mapper $306_3$ the lines of the bus $316_4$ may be mapped to the lines of the bus $317_4$ by the mapper $306_4$. Based on bits 16 and 15 of ADRS_R, the multiplexer 318 connects one of the busses $317_1$-$317_4$ to the bus 319. Based on bit 0 of ADRS_R, either a first portion or a second portion of the lines of the bus 319 are connected to the lines of the read data bus 216.

FIG. 3B depicts an exemplary memory instance. Shown in FIG. 3B is an exemplary memory instance $314_Y$ which may correspond to any one of the memory instances $314_1$-$314_4$ shown in FIG. 3A. The memory instance $314_Y$ comprises a row decoder 330, word/row lines 332[1:M], bit lines 336[1:N], memory cells $334_{1,1}$-$334_{M,N}$, column input/output module 338, and precharge transistors 347[1:N]. The cells $334_{1,1}$-$334_{M,N}$ may reside in one or more of the memory instances $314_1$-$314_4$ of one or more of the memory tiles $202_1$-$202_8$. Although a single-ended embodiment is depicted, each word line 332[m] and/or each bit line 336[n] could comprise two lines for differential signaling. As utilized herein the tem "bit line" is utilized for referring to both a single-ended bit line and a differential pair bit line.

The row decoder 330 may decode a portion of the binary encoded address on the bus 208 such that the row line corresponding to the address 208 is asserted (i.e. "selected") while the remaining word lines 332 are deasserted (i.e. "unselected").

Each of the memory cells $334_{1,1}$-$334_{M,N}$ may be operable to store a bit of data. Each memory cell may comprise, for example, cross-coupled inverters and one or more access transistors. Although, a six transistor (6T) SRAM memory cell is shown, the invention applies equally well to other well known memory cell designs.

The column input/output module 338 may select whether the bus 302 (see FIG. 3A) or a bus 316 (see FIG. 3A) is connected to the bit lines 336[1:N]. When we[Y], the bit of the write enable signal 312 corresponding to the memory instance $314_Y$, is asserted, the bus 316 corresponding to the memory instance $314_Y$ may be coupled to the bit lines 336[1:N], when we[y] is deasserted the bus 302 may be connected to the bit lines 336[1:N].

The precharge transistors 347[1:N] may apply $V_{mem}$ to the bit lines 336[1:N] during a write operation. In another embodiment of the invention, the memory instance $314_Y$ may also comprise a plurality of precharge transistors which, when enabled, may apply $V_{mem}$ to the bit lines 336[1:N] just prior to a read operation.

Also shown in FIG. 3B is an expanded view of an exemplary one of the memory cells $334_{1,1}$-$334_{M,N}$. The expanded view depicts a portion of the differential bit lines 336[N]+ and 366[N]−, a portion of the word line 332[2], a pair of cross-coupled inverters 339 and 340, and cell access transistors 345 and 346. Although, a six transistor (6T) SRAM memory cell is shown, the invention applies equally well to other well-known memory cell designs.

In operation, the value of $V_{mem}$ may determine the number of faulty memory cells. This dependence on $V_{mem}$ may be due, for example, to variations in transistor threshold voltages among the memory cells $334_{1,1}$-$334_{M,N}$ and variations in the amount of time required to charge nodes within a cell to a given threshold voltage. Accordingly, during a calibration (e.g., a self-test during start-up) of the memory 200, the value of $V_{mem}$ may be adjusted to achieve a desired balance between performance (e.g., as measured in terms of number of faulty cells and/or rate at which data can be written and/or read from the memory) and power consumption, for a given application.

Similarly, various parameters of the memory cells $334_{1,1}$-$334_{M,N}$ may affect how many of memory cells $334_{1,1}$-$334_{M,N}$ are faulty for given process, voltage, and temperature conditions. Such parameters may include various physical dimensions of the memory cells $334_{1,1}$-$334_{M,N}$. For example, the parameters may include one or more dimensions (e.g., gate width and/or length) of one or more transistors (e.g., precharge transistors 347[1:N], the cell access transistors 345 and 346, and/or the transistors 341-344), a width of traces (i.e., "wires"), a spacing between traces, a size of contacts, a spacing of contacts, a size of diffusion wells, and/or a spacing between diffusion wells. Accordingly, when designing a memory for a particular application, one or more such parameters may be adjusted to achieve a desired balance between performance (e.g., as measured in terms of number of faulty cells and/or rate at which data can be written and/or read from the memory) and memory area.

Figure 3C:
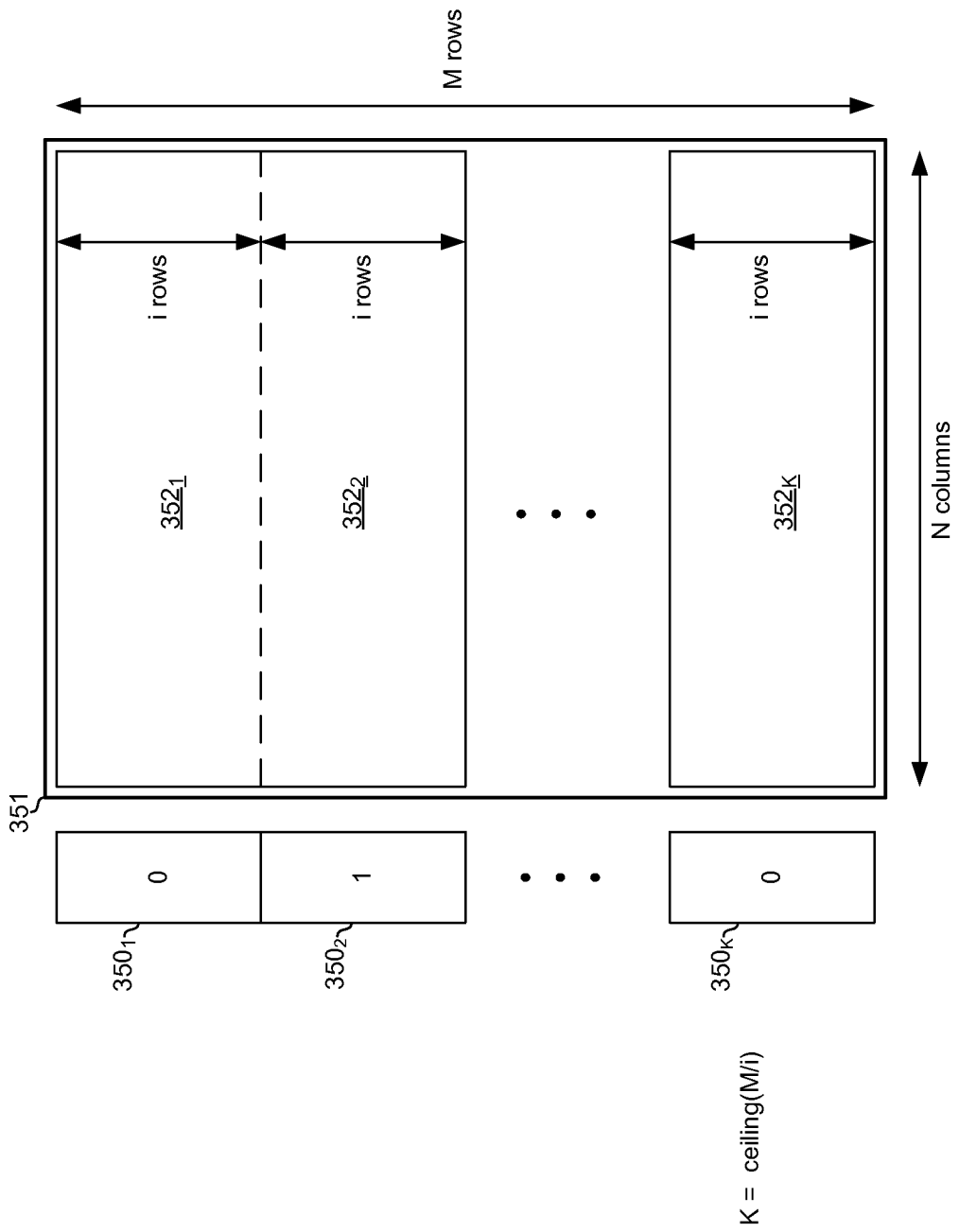
FIG. 3C illustrates an exemplary mapping between a fault register and memory cells managed via the fault register.

FIG. 3C illustrates an exemplary mapping between a fault register and memory cells managed via the fault register. Referring to FIG. 3C, there is shown an M row by N column block of memory 351, wherein M and N are integers, and one or both of them is greater than 1. The block of memory 351 may, for example, correspond to memory cells $334_{1,1}$-$334_{M,N}$ of memory 200. In an exemplary embodiment of the invention, each row of memory 351 may correspond to a particular memory address (and thus each row may be an "array" as that term is utilized herein). In another embodiment, each row may comprise a plurality of arrays corresponding to a plurality of memory addresses. In still another embodiment, arrays in the memory block 351 may span multiple rows and, thus, a single memory address may correspond to multiple rows.

Also shown are memory cells $350_1$-$350_K$ of the fault register 304, where K=ceiling(M/i), "ceiling( )" denotes a rounding up to the nearest integer, and i is an integer between 1 and M, inclusive. Each first portion 352 of the memory block 351 may correspond to i rows of memory cells of the memory block 351 and may be associated with one of the fault register memory cells $350_1$-$350_K$. Thus, larger values of i may correspond to smaller fault registers, while smaller values of i may provide better mitigation of faulty cells in the memory block 351. Accordingly, aspects of the invention may enable adjusting i based on the value of $V_{mem}$. For example, smaller values of i may be utilized with smaller values of $V_{mem}$ and visa-versa. Different combination of i and $V_{mem}$ may be optimal for different applications of the block of memory 351. For example, a first combination of values of i and $V_{mem}$ may be optimal when storing a first data type to the block of memory 351, and a second combination of values of i and $V_{mem}$ may be optimal when storing a second data type to the block of memory 351. Different data types may, for example, correspond to different formats and/or standards.

Similarly, aspects of the invention may enable adjusting i based on a sizing of transistors of the memory block 351. For example, smaller transistor sizes (and thus smaller memory cell sizes) may be utilized with smaller values of i. In this manner, the size of the fault register and size of the block of memory 351 may be adjusted to achieve an optimum design trade-off. In an exemplary embodiment of the invention, all parameters—$V_{mem}$, i, and sizes of individual transistors—may be adjusted to achieve an optimum power, area, and performance trade-off for a given application. Such adjustments/optimizations of i may take place during production of the block of memory 351, and/or during a calibration routine which may, for example, be run at start-up of the block of memory 351.

The exemplary embodiment in FIG. 3C wherein one fault register cell $350_k$ corresponds to each i rows of the block of memory 351, may correspond to an embodiment in which arrays are zoned into two sensitivity zones (sensitivity zones are described in further detail below). The invention, however, is not so limited, and more than one fault register bit may correspond to each i rows of the block of memory 351. In an exemplary embodiment of the invention, the number of fault register cells that correspond to each i rows may be equal to ceiling($\log_2 R$), where R is an integer greater than 1 that represents the number of sensitivity zones. For example, for R=4 (e.g., High, Med. High, Med. Low, and Low) sensitivity zones, there may be two fault register cells for each i rows of memory. In an embodiment of the invention, the value of R may be optimized for a particular application of the memory. The value of R may be adjusted along with adjustments to i, $V_{mem}$, and/or sizes of individual transistors.

Figure 3D:
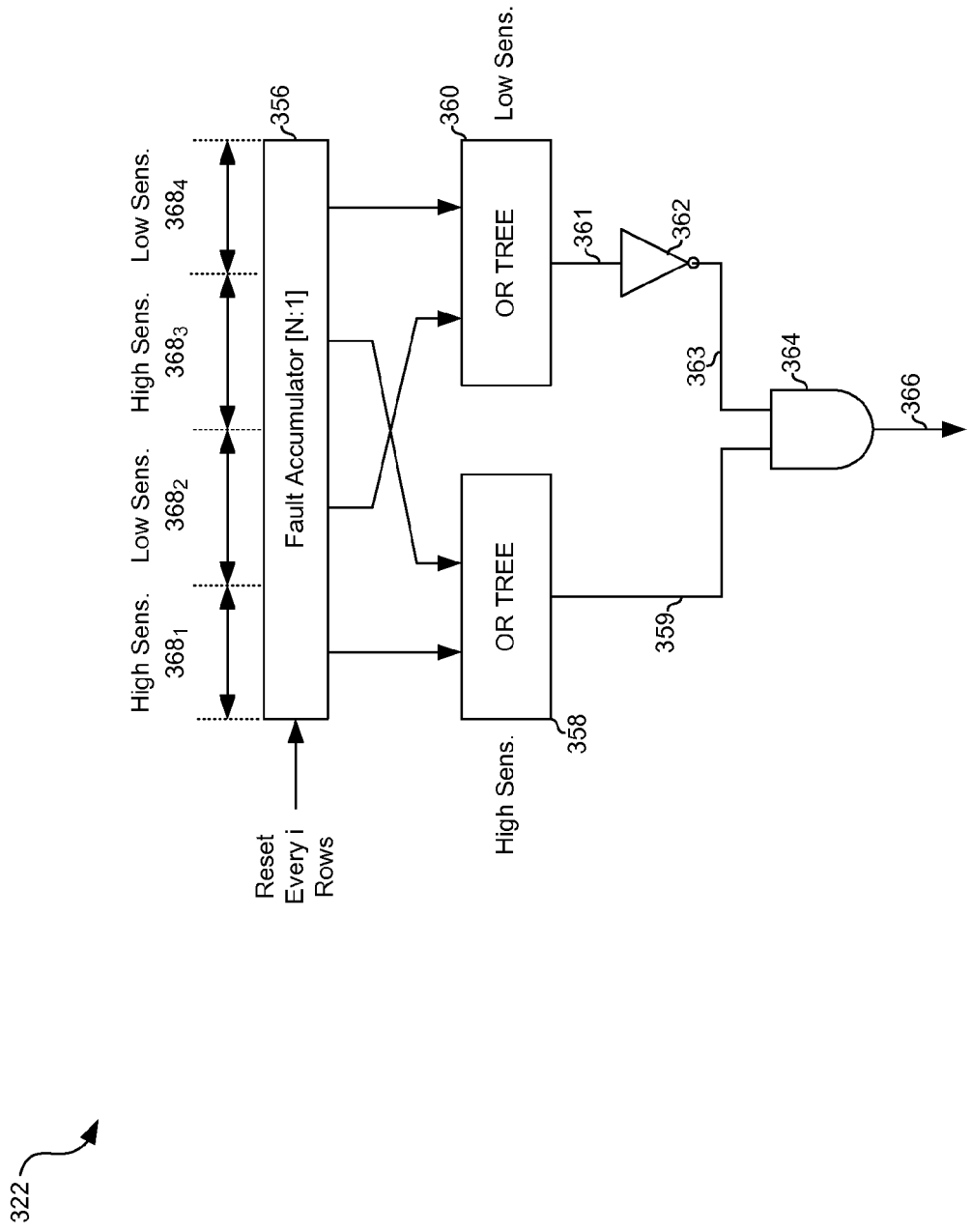
FIG. 3D illustrates an exemplary portion of a fault mitigation controller.

FIG. 3D illustrates an exemplary portion of a fault mitigation controller. Referring to FIG. 3D, the depicted portion of the fault mitigation controller 322 comprises a fault accumulator 356, and logic modules 358, 360, 362, and 364.

In operation, upon start-up of the memory 200, a scan of the memory 200 may be initiated. The scan may comprise writing test data to memory, reading the test data from memory, and then comparing the written data to the read data to detect faulty memory cells. Each cell or group of cells of the fault accumulator 356 may correspond to a particular column of memory in the block of memory being scanned. Accordingly, for the i rows being tested, each time a faulty cell is detected in a particular column, the one or more bits of the fault accumulator 356 corresponding to that column are incremented.

To illustrate, consider the portion of cells $352_1$ (FIG. 3C) corresponding to the first i rows of a block of memory 351. Test data may be written to and then read from the cells in portion $352_1$ to detect any faulty cells in portion $352_1$. For each column 1 through N, the one or more bits of the fault accumulator 356 corresponding to that column may be incremented each time a faulty memory cell is detected in that column of the portion $352_1$. Once all cells in the portion $352_1$ have been tested, one or more logical and/or arithmetic operations are applied to the contents of fault accumulator 356 to determine whether the cell $350_1$ of the fault register should be asserted or deasserted. Cell $350_1$ being asserted may indicate that one or more fault mitigation mappers (e.g., fault-mitigation mappers $306_1$-$306_5$ of FIG. 3A) are to utilize a first data-line to bit-line mapping when writing to and reading from an array in the portion $352_1$. Conversely, cell $350_1$ being deasserted may indicate that one or more fault mitigation mappers (e.g., fault-mitigation mappers $306_1$-$306_5$ of FIG. 3A) are to utilize a second data-line to bit-line mapping when writing to and reading from an array in the portion $352_1$.

The logical and/or arithmetic operations performed on the contents of the fault accumulator 356 may depend on which columns of the portion $352_1$ correspond to high-sensitivity zones and which columns of the portion $352_1$ correspond to low-sensitivity zones. In the exemplary portion depicted, there are high-sensitivity portions $368_1$ and $368_3$ and low-sensitivity portions $368_2$ and $368_4$, each of the portions each comprising one or more bits corresponding to one or more columns of the memory block 351. The bit(s) of the portions $368_1$ and $368_3$ are logically ORed by module 358, to generate signal 359. The bit(s) of the portions $368_2$ and $368_4$ are logically ORed by module 360, to generate signal 361. The signal 361 is inverted by inverter 362, to generate signal 363. Signals 361 and 363 are ANDed to generate signal 366. If signal 366 is asserted, then a 1 may be written to memory cell $350_1$ and if signal 366 is deasserted, then a 0 may be written to memory cell $350_1$.

Each of portions $352_2$-$352_K$, may be scanned for faults in a manner similar to that described above for portion $352_1$. Each of the fault register cells $350_2$-$350_K$ may be populated in a manner similar to that described above for cell $350_1$.

FIGS. 4A-4E depict an exemplary system in which an array of memory is zoned into two sensitivity zones for mitigating the impact of one or more faulty cells in the array. Shown in FIGS. 4A-4E are an array of memory cells 400, a fault register 402 associated with the array 400, and an 8-bit data block to be written to the array 400. In the exemplary embodiment depicted in FIGS. 4A-4E the array 400 is 8 bits and the data block is 8 bits, but the invention is not so limited.

Based on the data to be stored to the array 400, the cells of the array 400 may be zoned into a high sensitivity zone and a low sensitivity zone. To illustrate, in the exemplary embodiment depicted in FIGS. 4A-4C, the data block 404 is an 8-bit number with bit [7] being the MSB and bit [0] being the LSB. In this embodiment, an error in one of bits [7:4] of the data block 404 would cause a larger deviation in system performance from the correct value than would an error in one of bits [3:0] of the data block 404. For example, in a digital communication or video system, bit error rate (BER), packet error rate (PER), or frame error rate (FER) may be lower with an error in bits [7:4] than with an error in bits [3:0]. Accordingly, the upper four cells (cells [7:4]) have been zoned as higher sensitivity cells, and the lower four cells (cells [3:0]) have been zoned as lower sensitivity cells. In an embodiment of the invention, which sensitivity zone a cells and/or column should be assigned to may be determined based on a normalized difference in a system performance metric (e.g., bit error rate (BER)) due to that cell and/or column being faulty as compared to that cell and/or column being functional.

In operation, the mapping between the cells [7:0] of the array 400 and the bits [7:0] of the data block 404 may be determined based on a mapping indicated by the fault register 402.

Figure 4A:
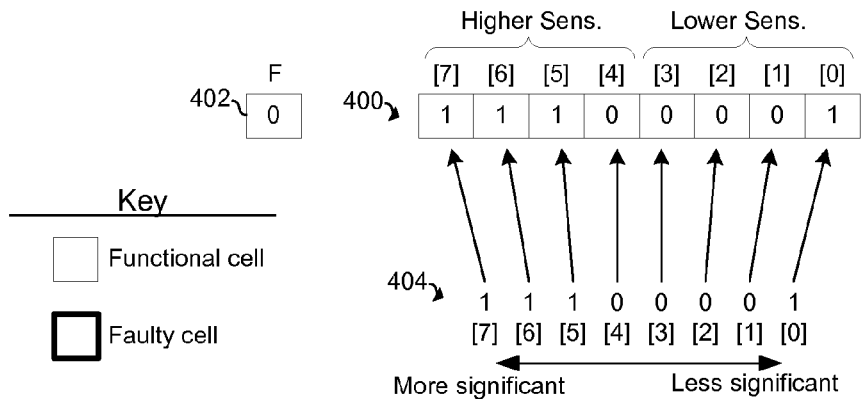
FIGS. 4A-4E depict an exemplary system in which an array of memory is zoned into two zones for mitigating the impact of one or more faulty cells in the array.

In FIG. 4A, there are no faulty cells in the array 400. Accordingly, the fault register 402 indicates that a first mapping is to be utilized. In the exemplary embodiment depicted in FIGS. 4A-4E, the first mapping results in the bits [0:N] of the data block 404 being written sequentially to the cells [0:N] of the array 400. That is, the mapping utilized in FIG. 4A is as shown in table 1 below.

TABLE 1

| Cell of array 400 | Bit of data block 404 |
|---|---|
| [0] | [0] |
| [1] | [1] |
| [2] | [2] |
| [3] | [3] |
| [4] | [4] |
| [5] | [5] |
| [6] | [6] |
| [7] | [7] |

Figure 4B:
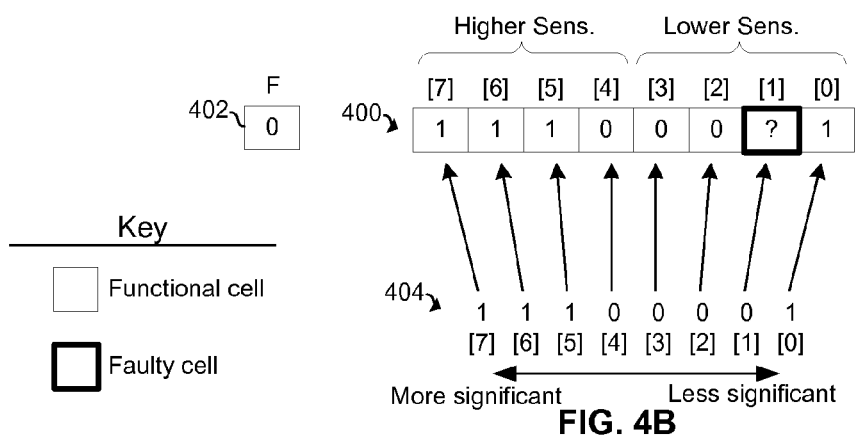

In FIG. 4B, there is a faulty memory cell (cell [1]) in the lower sensitivity zone, but none in the higher sensitivity zone. Accordingly, the fault register 402 indicates that the first mapping is to be used.

Figure 4C:
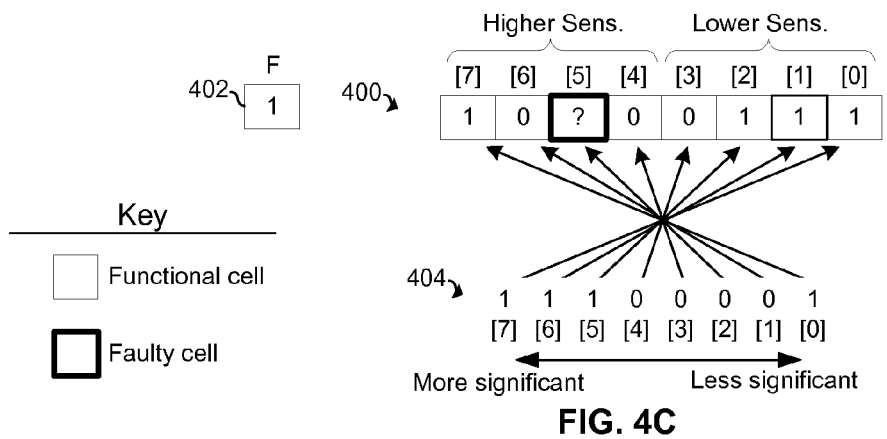

In FIG. 4C, there is a faulty memory cell (cell [5]) in the higher sensitivity zone and none in the lower sensitivity zone. Accordingly, the fault register 402 indicates that a second mapping is to be used. In the exemplary embodiment depicted in FIGS. 4A-4E, the second mapping results in the bits [0:N] of the data block 404 being written reverse-sequentially to the cells [0:N] of the array 400. That is, the mapping utilized in FIG. 4C is as shown in table 2 below.

TABLE 2

| Cell of array 400 | Bit of data block 404 |
|---|---|
| [0] | [7] |
| [1] | [6] |
| [2] | [5] |
| [3] | [4] |
| [4] | [3] |
| [5] | [2] |
| [6] | [1] |
| [7] | [0] |

Figure 4D:
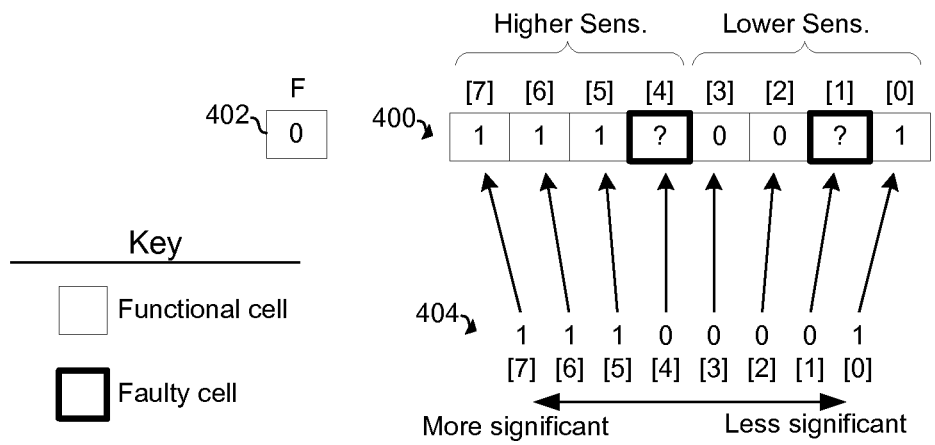
Figure 4E:
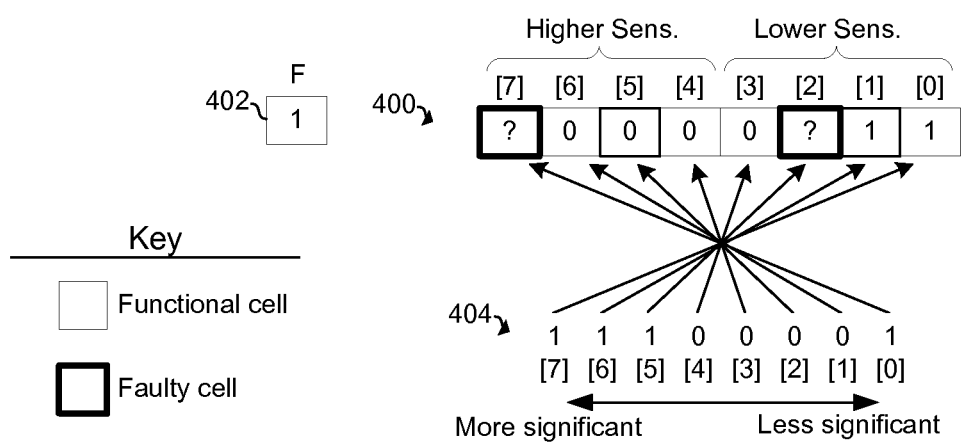

In FIG. 4D, there is a faulty memory cell (cell [4]) in the higher sensitivity zone and a faulty memory cell (cell [1]) in the lower sensitivity zone. Aspects of the invention may enable comparing the potential error in the value of the data block 404 for each available mapping to determine which mapping to utilize. To illustrate, in FIG. 4D, the first mapping results in a potential errors at bits 4 and 1, and the second mapping results in potential errors at bits 6 and 3. Accordingly, in FIG. 4D, the first mapping may be utilized. Similarly, in FIG. 4E, the first mapping results in potential errors at bits 7 and 2, and the second mapping results in potential errors at bits 5 and 0. Accordingly, in FIG. 4E, the second mapping is utilized.

While FIGS. 4A-4E depict two sensitivity zones, in practice the number of sensitivity zones utilized can be any integer greater than 1.

Figure 4F:
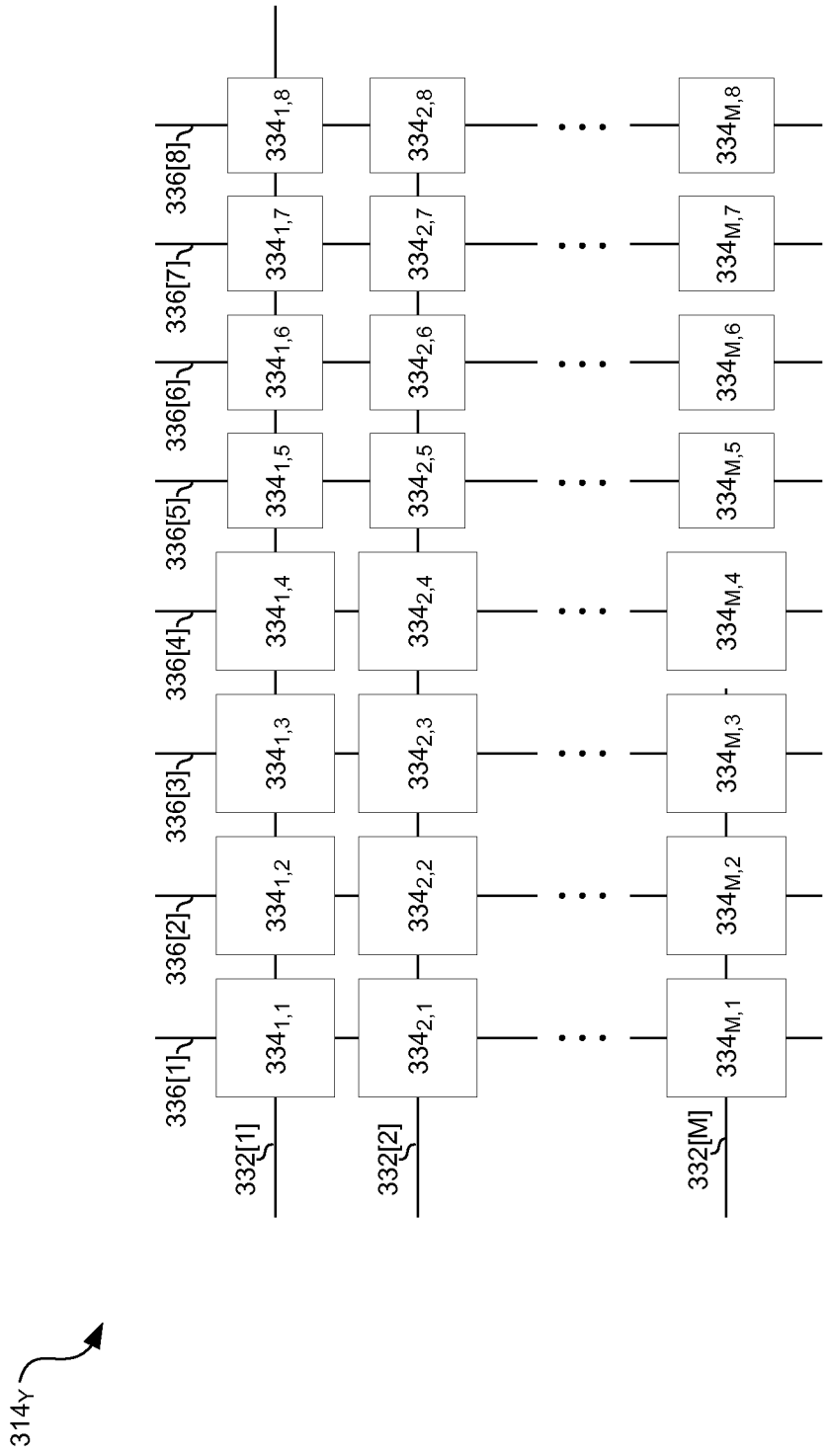
FIG. 4F depicts an exemplary memory array in which the size of each of the memory cells is related to the sensitivity of a system to that cell being faulty.

FIG. 4F depicts an exemplary memory array in which the size of each of the memory cells is related to the sensitivity to the cell being faulty (as measured by, for example, bit error rate). Shown in FIG. 4F is an exemplary implementation of the memory instance $314_Y$ sized for storing data blocks like the data block 404 (i.e., 8 bit data blocks with upper four bits being higher-sensitivity and lower four bits being lower-sensitivity). That is, for each row m, the memory cells $334_{m,1}$-$334_{m,4}$ (the cells in the higher-sensitivity zone) are larger than the memory cells $334_{m,5}$-$334_{m,8}$ (the cells in the lower-sensitivity zone). This sizing may result in fewer faulty cells in the higher-sensitivity zone than in the lower-sensitivity zone. While FIG. 4F illustrates two cell sizes for two sensitivity zones, sizing based on sensitivity can be applied to any number of sensitivity zones.

Similarly, although FIG. 4F has a one-to-one correspondence between number of sensitivity zones and number of cell sizes, other relationships between number of sensitivity zones and number of cell sizes could be used. For example, there could be two cell sizes for four sensitivity zones, with the high-sensitivity zone and medium-high sensitivity zones having cells of a first, larger size, and the medium-low sensitivity zone and low sensitivity zone having cells of a second, smaller size.

Figure 4G:
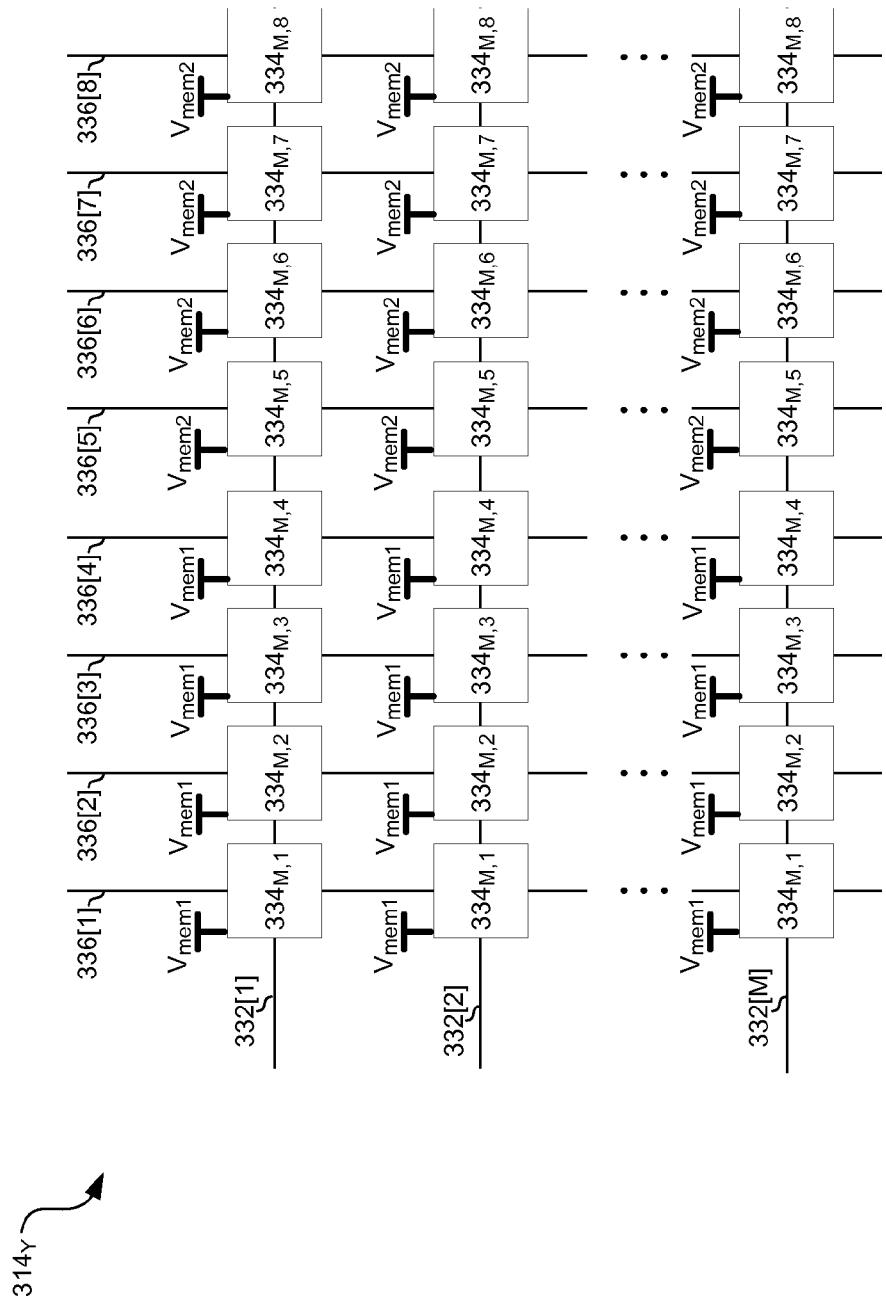
FIG. 4G depicts an exemplary memory array in which the supply voltage of each of the memory cells is related to the sensitivity of a system to that cell being faulty.

FIG. 4G depicts an exemplary memory array in which the supply voltage of each of the memory cells is related to the sensitivity to the cell being faulty (as measured by, for example, bit error rate). Shown in FIG. 4G is an exemplary implementation of the memory instance $314_Y$ with supply voltages configured for storing data blocks like the data block 404. That is, for each row m, the memory cells $334_{m,1}$-$334_{m,4}$ (the cells in the higher-sensitivity zone) are supplied with $V_{mem1}$ and memory cells $334_{m,5}$-$334_{m,8}$ (the cells in the lower-sensitivity zone) are supplied with $V_{mem2}$, wherein $V_{mem1} > V_{mem2}$. This configuration of supply voltages may result in fewer faulty cells in the higher-sensitivity zone than in the lower-sensitivity zone. While FIG. 4G illustrates two supply voltages for two sensitivity zones, supply voltage configuration based on sensitivity can be applied to any number of sensitivity zones. Similarly, although FIG. 4G has a one-to-one correspondence between number of sensitivity zones and number of supply voltages, other relationships between number of sensitivity zones and number of supply voltages could be used. For example, there could be two supply voltages for four sensitivity zones, with the high-sensitivity zone and medium-high sensitivity zones being supplied with a first, higher supply voltage, and the medium-low sensitivity zone and low sensitivity zone being supplied with a second, lower supply voltage.

Figure 5A:
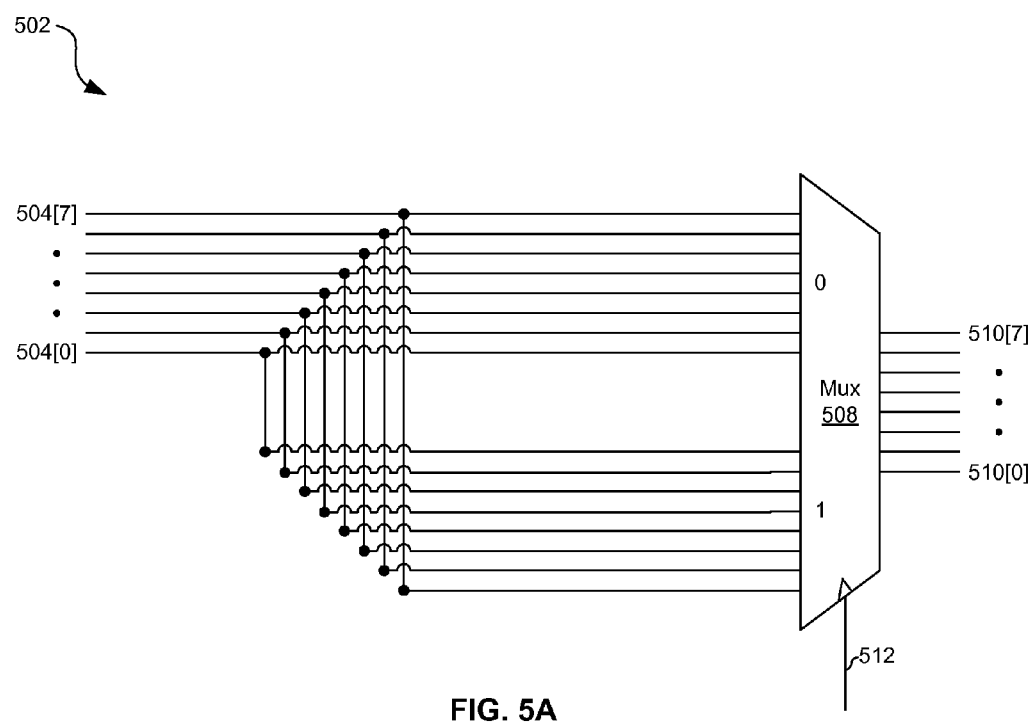
FIG. 5A depicts an exemplary fault mitigation mapping module.

FIG. 5A depicts an exemplary fault mitigation mapping module. Referring to FIG. 5A, the fault mitigation mapping module 502 comprises input lines 504[7:0], output lines 510[7:0], a multiplexer 508, and a control signal 512. When the control signal 512 is logic 0, the lines 504[7:0] may be mapped to the lines 510[7:0] as shown below in table 7. When the control signal 512 is logic 1, the lines 504[7:0] may be mapped to the lines 510[7:0] is as shown below in table 8.

TABLE 3

| | |
|---|---|
| 504 [0] | 510 [0] |
| 504 [1] | 510 [1] |
| 504 [2] | 510 [2] |
| 504 [3] | 510 [3] |
| 504 [4] | 510 [4] |
| 504 [5] | 510 [5] |
| 504 [6] | 510 [6] |
| 504 [7] | 510 [7] |

TABLE 4

| | |
|---|---|
| 504 [0] | 510 [7] |
| 504 [1] | 510 [6] |
| 504 [2] | 510 [5] |
| 504 [3] | 510 [4] |
| 504 [4] | 510 [3] |
| 504 [5] | 510 [2] |
| 504 [6] | 510 [1] |
| 504 [7] | 510 [0] |

The fault mitigation mapping module depicted in FIG. 5A achieves different mappings via re-ordering of signal lines. In this manner, delay introduced by the multiplexer 508 may be the only significant additional delay introduced by the fault mitigation mapping module 502. In other embodiments, however, the mapping may be achieved via one or more logic gates. Such other embodiments may be utilized, for example, when additional delay can be tolerated. In an embodiment of the invention, the mapping may be achieved by a permutation network such as, for example, a Benes permutation network.

Figure 5B:
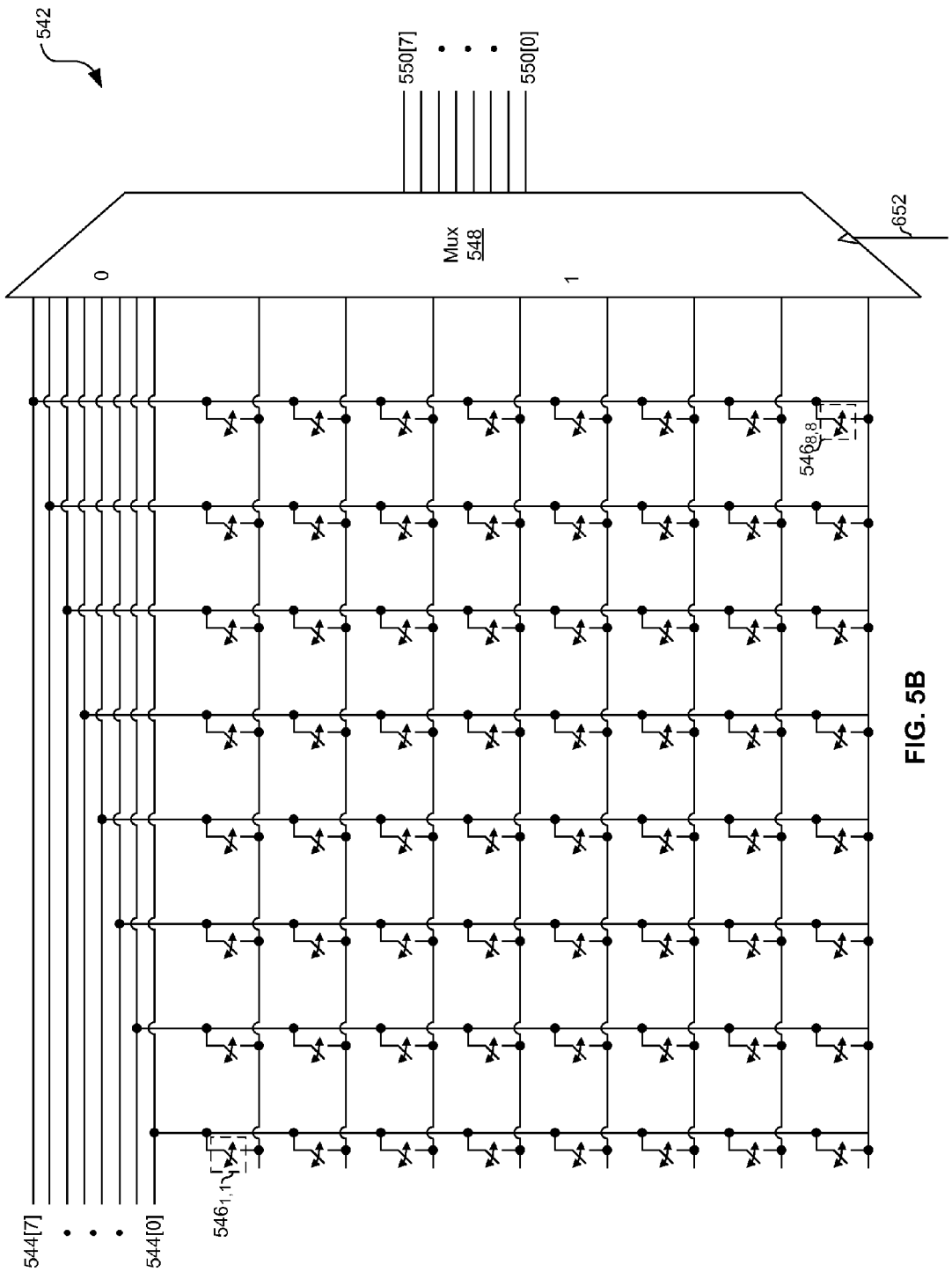
FIG. 5B depicts a system comprising a configurable fault mitigation mapping module.

FIG. 5B depicts a system comprising a configurable fault mitigation mapping module. Referring to FIG. 5B, the configurable fault mitigation mapping module 540 comprises input lines 544[7:0], output lines 550[7:0], a multiplexer 548, a control signal 552, and sixty-four configuration elements $546_{1,1}$-$546_{8,8}$. Although sixty-four configuration elements are utilized for illustration, the invention is not so limited.

Each of the configuration elements $546_{1,1}$-$546_{8,8}$ may comprise, for example, an NMOS transistor, a PMOS transistor, a CMOS transmission gate, a fuse, an anti-fuse, or any other device for making and/or breaking a connection between signal traces. The configuration elements $546_{1,1}$-$546_{8,8}$ may be one-time configurable, electronically configurable via a programming station, and/or dynamically configurable (e.g., by control signals from a processor such as the CPU 104) during operation of a device (e.g., receiver 150) in which the module 542 resides.

In operation, the module 542 may perform a first mapping when the signal 552 is logic 0 and may perform a second mapping when the signal 552 is logic 1.

In an exemplary embodiment where the module 542 is one-time programmable, the second mapping may be determined upon characterizing a particular memory that is to be utilized with the module 542. For example, the module may be paired with a memory 152 that has a faulty bit line [6] such that cell [6] of each row of the memory 152 is faulty. The module 542 may be programmed such that bit line [6] of the memory 152 is mapped to the one of the lines 544[7:0] that corresponds to the least significant bit of the data blocks that are written to the memory 152 via the module 542 (e.g., bit [0] of the data block 404).

In an exemplary embodiment the module 542 may be configured on a per memory, per-memory-instance, per-memory-address, and/or per-memory-array basis. For example, the configuration elements 542 may be placed into a first configuration when writing or reading memory from a first address of the memory 152 and may be placed into a second configuration when writing or reading from a second memory address of the memory 152.

Figure 6:
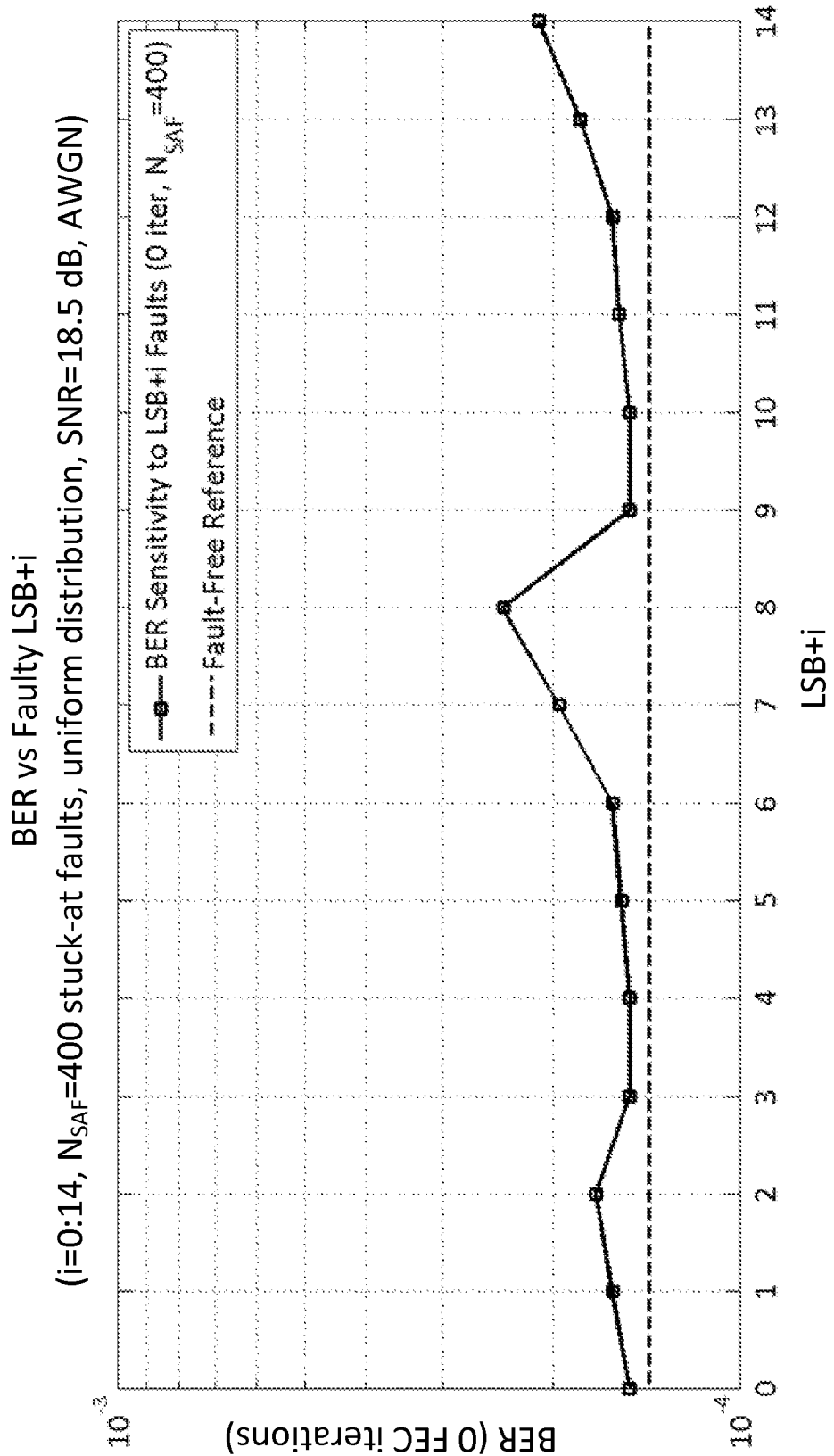
FIGS. 6 and 7 show simulation results of an exemplary implementation of a receiver utilizing aspects of the present invention.
Figure 7:
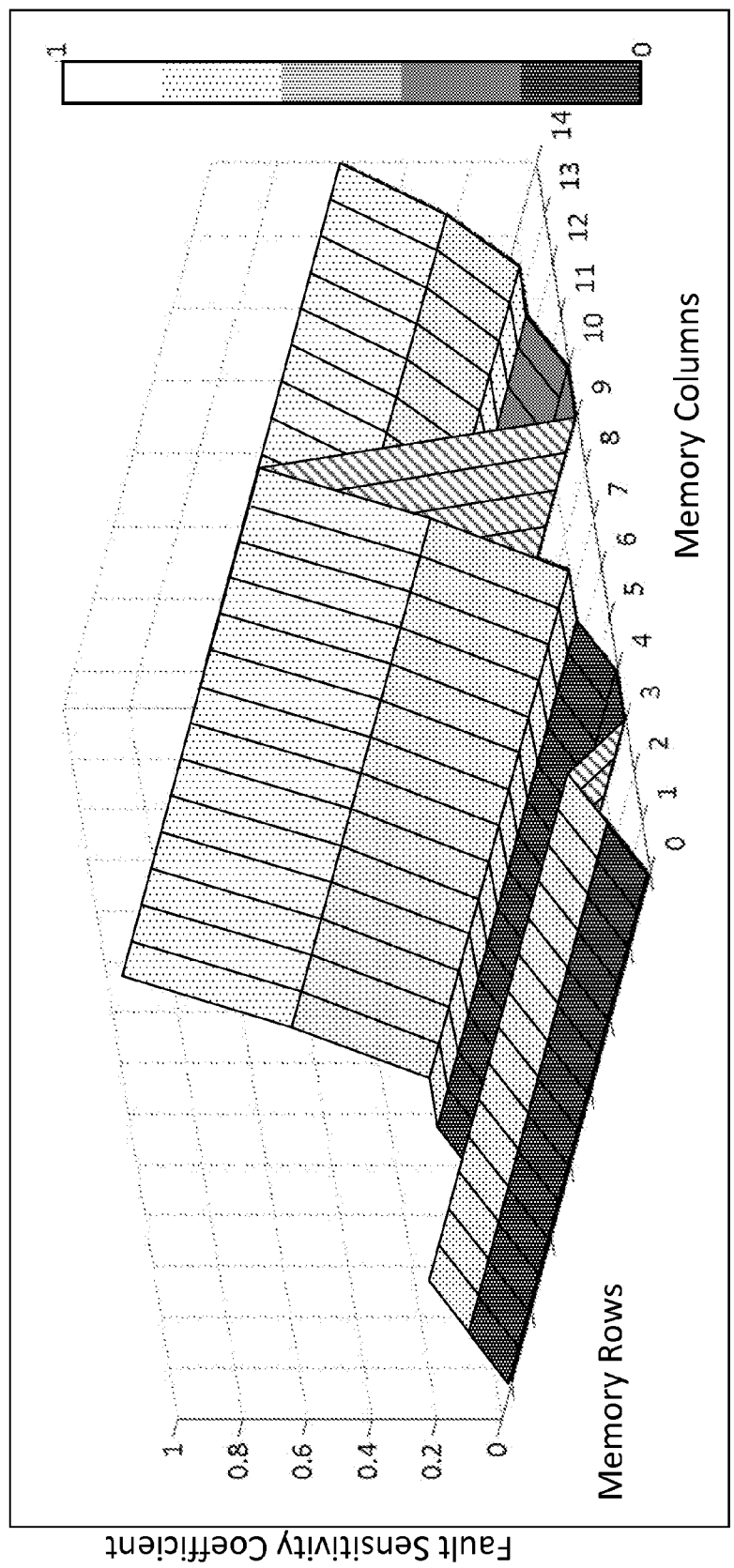

FIGS. 6 and 7 show simulation results of an exemplary implementation of the receiver 150. The simulation results presented in FIGS. 6 and 7 were obtained using uniformly-sized memory cells with nominal supply voltage Vmem.

FIG. 6. shows the impact of $N_{SAF}$=400 stuck-at-faults (SAF) in the Frequency Time De-Interleaver (FTDI) memory 152 on the decoding performance of an exemplary implementation of receiver 150 with Forward Error Correction (FEC) as measured by the Bit Error Rate (BER). For the simulation shown in FIG. 6, the de-interleaver memory 152 stores soft symbol data. $N_{SAF}$=400 stuck-at-faults were uniformly distributed and mapped to each bit in a memory word, as follows: $N_{SAF}$ faults were first introduced in the MSB of the symbol data and the BER due to the faults was recorded; next, $N_{SAF}$ faults were introduced in the remaining symbol data and in each case the BER due to the faulty bit was recorded for a fixed SNR=18.5 dB and an Additive White Gaussian Noise (AWGN) channel with 0 FEC decoding iterations. The simulation was repeated for each cell in the de-interleaver memory word.

Stuck-at-Faults (SAF) typically account for more than 50% of memory array faults and therefore SAF can be used as a first order approximation to a faulty memory array. For the simulation, a larger than expected number of $N_{SAF}$=400 stuck-at-faults was selected to account for other types of faults not modeled in the simulation and to test the system under high fault conditions. For the simulation, by setting a sensitivity threshold to 1.6×10-4 BER, or 7% above the fault-free reference, the high sensitivity (MSB) region contains all faulty bits with BER greater than the 1.6×10-4 threshold. Similarly, for the simulation, the LSB region (i.e. low sensitivity zone) of the same size contains all faulty bits with BER less than the 1.6×10-4 threshold. In the simulation, if a memory fault is found in the MSB region and no faults are found in the LSB region, the permutation of the MSB and LSB regions results in ΔSNR gain improvement compared to memory without repair.

Although, the receiver 150 utilizes aspects of the invention in combination with forward error correction techniques (i.e., Viterbi and Reed-Solomon encoding), aspects of the invention may improve system performance even without the use of additional error correction.

FIG. 7 shows a fault sensitivity coefficient for an exemplary Frequency Time De-Interleaver (FTDI) memory 152 due to stuck-at faults. FIG. 7 shows a fault sensitivity coefficient ζ for a section of the Frequency Time De-Interleaver (FTDI) memory based on the BER plot in FIG. 6. In the simulation, the FTDI memory columns store data symbols stored in memory rows. The fault sensitivity coefficient ζ was determined by taking the difference between the solid and dashed lines in FIG. 6, and then normalizing the difference to 1. That is, the fault sensitivity coefficient of a particular memory cell may correspond to the difference in a system performance metric (e.g., BER) due to that memory cell being faulty as compared to that memory cell being functional. The simulation results show that the data bits that are closest to the MSB have a higher fault sensitivity coefficient compared to bits that are closest to the LSB. As a result of permutation of MSB and LSB regions, utilizing aspects of the invention achieves the fault sensitivity exhibited by the LSB region for MSB region data, whenever the MSB region has faults and the LSB region is fault-free.

Figure 8:
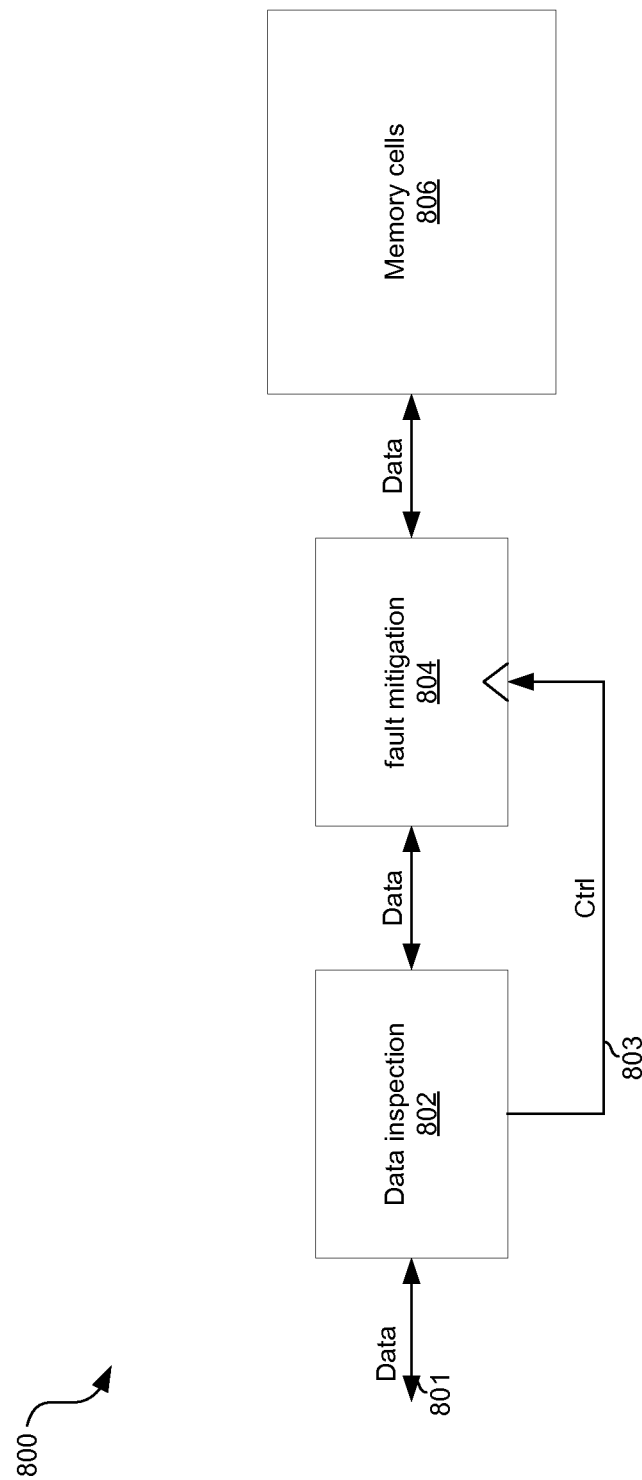
FIG. 8 is a block diagram illustrating datastream-dependent control of a memory fault mitigation module

FIG. 8 is a block diagram illustrating datastream-dependent control of a memory fault mitigation module. Shown in FIG. 8 is a device 800 comprising a data inspection module 802, a fault mitigation module 804, and a block of memory cells 806.

The inspection module 802 may be operable to control the fault mitigation module 804 based on an inspection of the datastream 801 being written to the memory 806. The data inspection module 802 may control the state of the signal 803 based on the type of data being output by the module 802. For example, the signal 803 may be synchronized to the data output by the module 802 and may indicate, for example, the type of data being output, and/or the sensitivity coefficient(s) of the data being output.

The fault mitigation module 804 may utilize the state of the control signal 803 to determine which mapping to utilize for the corresponding data of the datastream 801. The fault mitigation module 804 may utilize the state of the control signal 803 in combination with a fault register of the memory 806.

In an exemplary embodiment of the invention, when writing a packetized datastream 801 to the memory 806, the data inspection module 802 may put the control signal 803 into a first state when outputting payload bits and into a second state when outputting header bits. In such an embodiment, the fault mitigation module 804 may utilize a first mapping when there are no faulty cells in the array corresponding to the memory address being written to and/or payload bits are being written, and may utilize a second mapping when there is one or more faulty cells in the array corresponding to the memory address being written to and header bits are being written. When the second mapping is utilized, the fault mitigation module may keep track of which addresses utilized the second mapping to enable correctly reading the data out of memory. For example, a bit may be set in the fault register when the second mapping is utilized and/or a bit may be defined in the memory address to which the second mapping was applied.

In an exemplary embodiment of the invention, there may be a one-to-one correspondence between data types of the datastream 801 and states of the control signal 803. The control signal 803 may, for example, control the switching elements 546 (see FIG. 5B) based on to the type of data being written.

Figure 9:
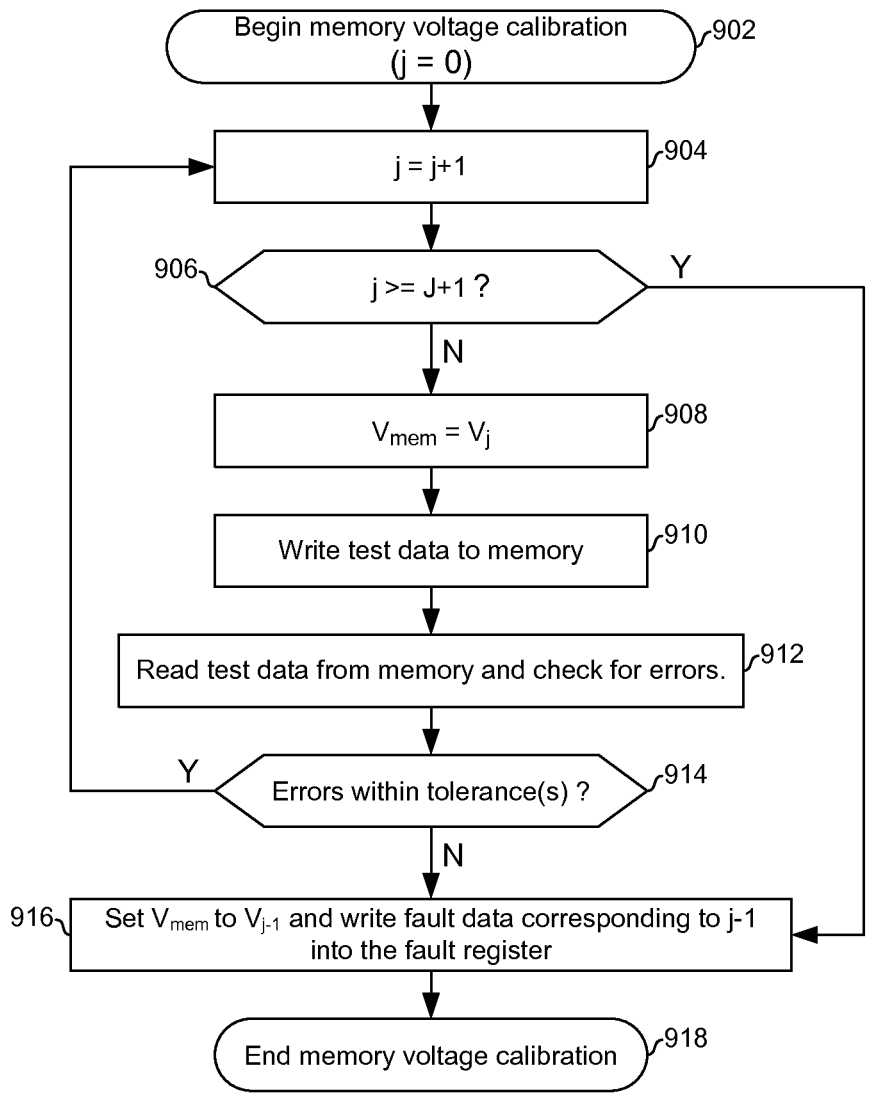
FIG. 9 is a flowchart illustrating exemplary steps for determining a supply voltage of a fault-tolerant memory.

FIG. 9 is a flowchart illustrating exemplary steps for determining a supply voltage of a fault-tolerant memory. The exemplary steps may start with step 902 in which a routine for calibrating $V_{mem}$ supplied to a memory. The calibration routine may occur, for example, during production testing of the memory and/or during a self-test performed at power-on or reset of the memory. Upon beginning the calibration routine, the variable j may be initialized to 0, where j is the index of a list of possible values of $V_{mem}$. For example, there may be J possible values of $V_{mem}$ (e.g., stored in a look-up table) with $V_1$ being the highest value of $V_{mem}$ and $V_J$ being the lowest possible value of $V_{mem}$.

In step 904, j may be incremented by 1. In step 906 if j is equal to J+1 (i.e. the lowest possible value of $V_{mem}$ was tested during the previous iteration of the exemplary steps 902-918), then the exemplary steps may advance to step 918. Returning to step 906, if j is greater than or equal to J+1, then the exemplary steps may advance to step 908. In step 908, $V_{mem}$ may be set to $V_j$.

In step 910, test data may be written to the memory. In step 912, the test data may be read from the memory and inspected for errors. In some instances, it may be assumed that, under the controlled conditions of the calibration routine, each of the errors in the data read from the memory are the result of a faulty memory cell.

In step 914, it may be determined whether the number and/or location of faulty memory cells in the memory is tolerable. The number and/or location of faulty memory cells that can be tolerated may depend on, for example, the type of data that will be stored to the memory, and/or the size of the fault register (i.e., the number of available mappings and/or the number of arrays associated with each cell 350 of the fault register). In an exemplary embodiment of the invention, the data may be inspected to determine whether the total number of faulty memory cells is above a threshold. In another embodiment of the invention, the data may be inspected to determine whether the number of arrays in the memory having more than a threshold number of faulty memory cells is above a threshold. In another embodiment of the invention, the data may be inspected to determine whether the number of arrays in the memory having errors in multiple sensitivity zones is above a threshold. If the detected faulty memory cells are tolerable, then the exemplary steps may return to step 904. If the detected errors are not tolerable, then the exemplary steps may advance to step 916.

In step 916, $V_{mem}$ may be set to $V_{j-1}$, and the fault register of the memory may be programmed based on the results of the inspection performed in step 912. That is, the contents of the fault register may be configured to indicate the presence and/or location of the faulty memory cells with $V_{mem}$ set to $V_{j-1}$. In step 918, the calibration of $V_{mem}$ is complete and the system may begin reading and writing actual data from/to the memory.

In an exemplary embodiment of the invention, multiple calibrations of $V_{mem}$ may be performed corresponding to multiple data types (note that multiple data types may correspond to multiple sets of sensitivity coefficients). The value of $V_{mem}$ suitable for different data types may be stored (e.g., in a look-up table), and then $V_{mem}$ may be dynamically configured based on the type of data to be stored in the memory via a voltage scaling unit (e.g., scaler 116 of FIG. 1A) for a given sensitivity zone.

Figure 10:
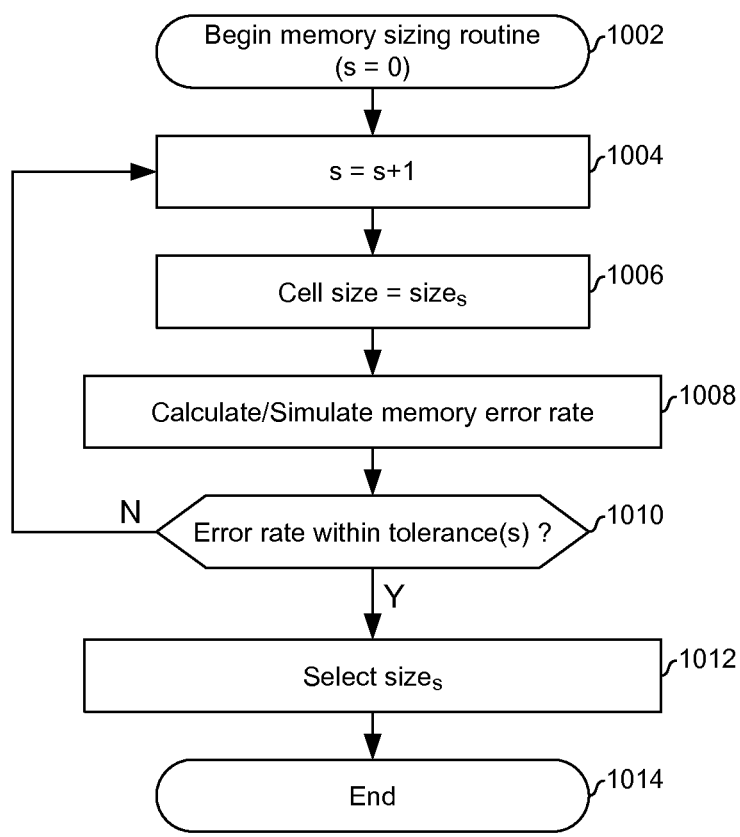
FIG. 10 is a flowchart illustrating exemplary steps for sizing memory cells of a fault-tolerant memory.

FIG. 10 is a flowchart illustrating exemplary steps for sizing memory cells of a fault-tolerant memory. The exemplary steps may start with step 1002 in which a sizing routine begins. The sizing routine may occur, for example, during a design phase of a memory. Upon beginning the sizing routine, a variable s may be initialized to 0, where s is used as a size index. For example, cell size may be denoted "size$_s$" with size$_1$ being the smallest possible cell size, and the cell size increasing as s increases.

In step 1004, j may be incremented by 1. In step 1006, the cell size may be set to size, and the number and/or location of faulty cells in the memory with a cell size of size, may be simulated and/or otherwise calculated. In step 1010, it may be determined whether the number and/or location of faulty memory cells determined in step 1008 is tolerable. The number and/or location of faulty memory cells that can be tolerated may depend on, for example, the type of data that will be stored to the memory, and/or the size of the fault register (i.e., the number of available mappings and/or the number of arrays associated with each cell 350 of the fault register). If the number of faulty memory cells is not tolerable, then the exemplary steps may return to step 1004. If the number of faulty memory is tolerable, then the exemplary steps may advance to step 1012. In step 1012, size, may be selected as the cell size with which to build the memory. In step 1014 the sizing routine is complete.

Figure 11:
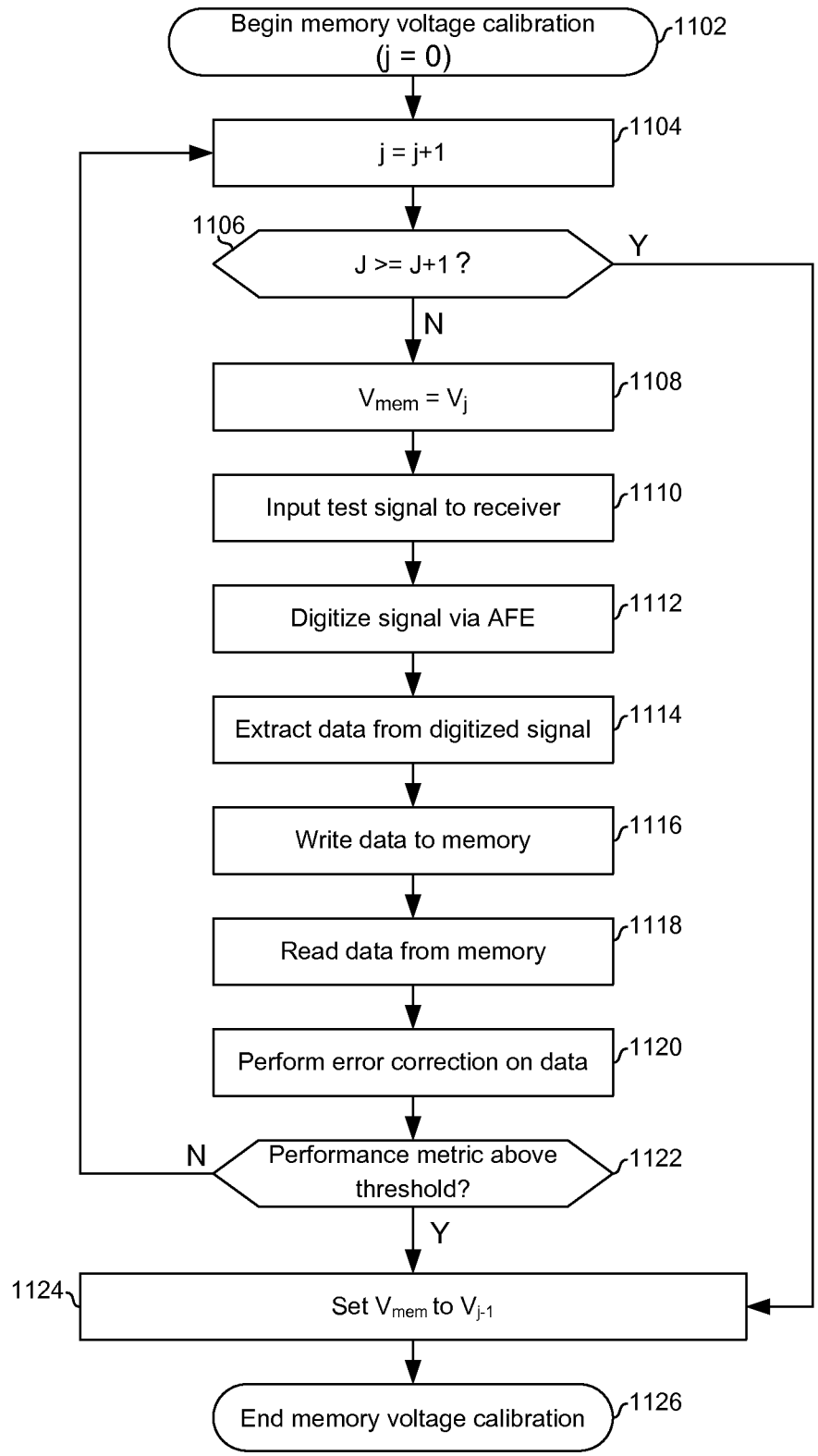
FIG. 11 is a flowchart illustrating exemplary steps for determining a supply voltage of a fault-tolerant memory.

FIG. 11 is a flowchart illustrating exemplary steps for determining a supply voltage of a fault-tolerant memory in a receiver. The exemplary steps may start with step 1102 when a calibration of the voltage $V_{mem}$ supplied to a memory may begin. The calibration routine may occur, for example, during production testing of the memory and/or during a self-test performed at power-on or reset of the memory. Upon beginning the calibration routine, the variable j may be initialized to 0, where j is the index of a list of possible values of $V_{mem}$. For example, there may be J possible values of $V_{mem}$ (e.g., stored in a look-up table) with $V_1$ being the highest value of $V_{mem}$, and $V_J$ being the lowest possible value of $V_{mem}$.

In step 1104, j may be incremented by 1. In step 1106 if j is equal to J+1 (i.e. the lowest possible value of $V_{mem}$ was tested during the previous iteration of the exemplary steps 1102-1126) then the exemplary steps may advance to step 1124. Returning to step 1106, if j is greater than or equal to J+1, then the exemplary steps may advance to step 1108. In step 1108, $V_{mem}$ may be set to $V_J$.

In step 1110, a test signal may be input to the receiver. The test signal may, for example, be generated by a test station, and/or may be generated by a transmitter collocated with the receiver and looped-back into the receiver. The test signal may, for example, represent a corner case or worst-case scenario such that successful recovery of the data contained in the test signal may be a reliable indicator that the receiver will be able to successfully receive signals that it is required to receive (e.g., signals that meet specifications set forth in one or more standards).

In step 1112 the test signal may be digitized and otherwise processed by an analog front end (e.g., AFE 102). In step 1114, the data contained in the digitized signal may be recovered by, for example, demodulating and decoding the digitized signal. In step 1116, the recovered data may be written to the memory. In step 1118, the data may be read out of the memory. In step 1120, one or more error correction algorithms (e.g., Viterbi and Reed-Solomon) may be applied to the read-out data. Note that, although the exemplary steps reflect a single read and write to memory, the demodulating, decoding, error-correcting, and/or other processing of the signal may actually require multiple reads and writes to memory.

In step 1122, a performance metric (e.g., bit-error rate) may be measured for the error-corrected data and compared to a threshold. If the performance metric is below a threshold, then the exemplary steps may return to step 1104. If the performance metric is above the threshold, then the exemplary steps may advance to step 1124.

In step 1124, $V_{mem}$ may be set to $V_{j-1}$. In step 1126, the calibration of $V_{mem}$ is complete and the system may begin reading and writing actual data from/to the memory.

In an exemplary embodiment of the invention, an array of memory cells $334_{1,1}$-$334_{M,N}$ may be scanned to detect faulty memory cells, if any, in the array. A supply voltage $V_{mem}$ applied to the array of memory cells may be controlled based on a result of the scan, and based a sensitivity coefficient of one or more of the memory cells. The sensitivity coefficient may indicate an impact that the one or more of cells being faulty may have on performance of a device (e.g., the receiver 150) which reads and writes data to the memory array. The sensitivity coefficient may be determined by comparing: a performance metric of the electronic device without the one or more of the memory cells being faulty, and the performance metric of the electronic device with the one or more of the memory cells being faulty. Controlling the supply voltage may comprise reducing the supply voltage $V_{mem}$ when the result of the scan indicates that more faulty memory cells can be tolerated in the array of memory cells. Controlling the supply voltage may comprises increasing the supply voltage when the result of the scan indicates that the number of faulty memory cells in the array of memory cells is more than can be tolerated.

In an exemplary embodiment of the invention, an array of memory cells $334_{1,1}$-$334_{M,N}$ may be scanned to detect faulty memory cells, if any, in the array. The contents of a fault register (e.g., fault register 304) may be configured based on a result of the scanning. Test data may be to the array of the memory cells. The order in which bits of the test data are written to the array of memory cells may be determined by the contents of the fault register. The test data may then be read from the array of memory cells. The order in which bits of the test data are read from the array of memory cells may be determined by the contents of the fault register. A supply voltage $V_{mem}$ applied to the array of memory cells may be controlled based on a measured performance metric of the test data read from the memory. The controlling of the supply voltage may comprise reducing the supply voltage when the result of the scanning indicates that more faulty memory cells can be tolerated in the array of memory cells. The controlling of the supply voltage may comprise increasing the supply voltage when the result of the scanning indicates that the number of faulty memory cells in the array of memory cells is more than can be tolerated. The performance metric may, for example, be bit-error rate and/or packet-error rate. The scanning may be performed upon start-up or reset of the array of memory cells.

In an exemplary embodiment of the invention, one or more circuits may comprise an array of memory cells $334_{1,1}$-$334_{M,N}$. A size of one or more transistors (e.g., one or more of transistors 341-346) of the memory cells may be correlated with (i.e. depend on and/or have a relationship to) one or more sensitivity coefficients of the array of memory cells. Additionally or alternatively, the size of the one or more transistors of the memory cells may be correlated (i.e. depend on and/or have a relationship to) a number of faulty memory cells that can be tolerated in the array of memory cells. The one or more circuits may comprise a fault register. The size of the fault register may be correlated with (i.e. depend on and/or have a relationship to) the size of the one or more transistors. Additionally or alternatively, and the size of the one or more transistors may be correlated with (i.e. depend on and/or have a relationship to) the size of the fault register. The one or more circuits comprise a multiplexer, and a data bus comprising a plurality of data lines. The array of memory cells may correspond to a particular memory address and may be coupled to a plurality of bit lines. The plurality of data lines and the plurality of bit lines may be used to write to and/or read from the array of memory cells. The multiplexer may select among different mappings between the plurality of data lines and the plurality of bit lines. A configuration of the multiplexer may be controlled based, at least in part, on which, if any, of the memory cells is faulty.

Other embodiments of the invention may provide a non-transitory machine-readable (e.g., computer-readable) medium and/or storage medium, having stored thereon, a machine code and/or a computer program having at least one code section executable by a machine and/or a computer, thereby causing the machine and/or computer to perform the steps as described herein for memory power and/or area reduction.

Accordingly, the present invention may be realized in hardware, software, or a combination of hardware and software. The present invention may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an Application Specific Integrated Circuit (ASIC) or a System-on-Chip (SoC).

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A system comprising:
    an electronic device comprising power supply, one or more memory cells, and digital circuitry other than said one or more memory cells, wherein:
        said digital circuitry other than said one or more memory cells is powered via a first supply voltage generated by said power supply;
        said one or more memory cells are powered via a second supply voltage generated by said power supply;
        said power supply is operable to:
            control said first supply voltage independent of said second supply voltage; and
            adjust said second supply voltage based on a type of data stored in said one or more memory cells;
        said one or more memory cells are a first one or more memory cells; and
        said system also comprises a second one or more memory cells powered via a third supply voltage generated by said power supply.

2. The system of claim 1, wherein a first type of said data adheres to a first communication standard and a second type of data adheres to a second communication standard.

3. The system of claim 1, wherein said first type of said data is of a first format and a second type of data is of a second format.

4. The system of claim 1, wherein said power supply is operable to adjust said second supply voltage based on a tolerable error rate for data stored in said one or more memory cells.

5. The system of claim 1, wherein said power supply is operable to control said third supply voltage independent of said second supply voltage and independent of said first supply voltage.

6. The system of claim 1, wherein:
    said first one or more memory cells hold a corresponding one or more most significant bits of a data word; and
    said second one or more memory cells hold a corresponding one or more least significant bits of said data word.

7. The system of claim 6, wherein cell size of said first one or more memory cells is the same as cell size of said second one or more memory cells.

8. The system of claim 7, wherein said second supply voltage is higher than said third supply voltage.

9. The system of claim 6, wherein cell size of said first one or more memory cells is larger than cell size of said second one or more memory cells.

10. The system of claim 9, wherein said second supply voltage is equal to said third supply voltage.

11. The system of claim 1, wherein:
    said first one or more memory cells hold a corresponding one or more bits of a data word having a first fault sensitivity coefficient; and said second one or more memory cells hold a corresponding one or more bits of said data word having a second fault sensitivity coefficient.

12. The system of claim 11, wherein cell size of said first one or more memory cells is the same as cell size of said second one or more memory cells.

13. The system of claim 12, wherein said second supply voltage is higher than said third supply voltage.

14. The system of claim 11, wherein cell size of said first one or more memory cells is larger than cell size of said second one or more memory cells.

15. The system of claim 1, wherein said second supply voltage is equal to said third supply voltage.

16. The system of claim 1, wherein each of said one or more memory cells comprises cross-coupled inverters.

17. The system of claim 16, wherein said first supply voltage is applied to source nodes of PMOS transistors of each one of said cross-coupled inverters.

18. The system of claim 1, wherein said adjustment results in said second supply voltage being a first voltage when a first type of data is stored in said one or more memory cells and said second supply voltage being a second voltage when a second type of data is stored in said one or more memory cells.

19. The system of claim 1, wherein said second supply voltage is applied to a source node of one or more access transistors that provide power to said one or more memory cells.

20. A system comprising:
an electronic device comprising a power supply, one or more memory cells, and digital circuitry other than said one or more memory cells, wherein:
said digital circuitry other than said one or more memory cells is powered via a first supply voltage generated by said power supply;
said one or more memory cells are powered via a second supply voltage generated by said power supply;
said power supply is operable to:
control said first supply voltage independent of said second supply voltage; and
adjust said second supply voltage based on a type of data stored in said one or more memory cells;
each of said one or more memory cells comprises cross-coupled inverters; and
said first supply voltage is applied to source nodes of PMOS transistors of each one of said cross-coupled inverters.

21. The system of claim 20, wherein a first type of said data adheres to a first communication standard and a second type of data adheres to a second communication standard.

22. The system of claim 20, wherein said first type of said data is of a first format and a second type of data is of a second format.

23. The system of claim 20, wherein said power supply is operable to adjust said second supply voltage based on a tolerable error rate for data stored in said one or more memory cells.

24. The system of claim 20, wherein:
said one or more memory cells are a first one or more memory cells;
said system also comprises a second one or more memory cells powered via a third supply voltage generated by said power supply; and
said power supply is operable to control said third supply voltage independent of said second supply voltage and independent of said first supply voltage.

25. The system of claim 20, wherein:
said one or more memory cells are a first one or more memory cells;
said system also comprises a second one or more memory cells powered via a third supply voltage generated by said power supply;
said first one or more memory cells hold a corresponding one or more most significant bits of a data word; and
said second one or more memory cells hold a corresponding one or more least significant bits of said data word.

26. The system of claim 25, wherein cell size of said first one or more memory cells is the same as cell size of said second one or more memory cells.

27. The system of claim 26, wherein said second supply voltage is higher than said third supply voltage.

28. The system of claim 25, wherein cell size of said first one or more memory cells is larger than cell size of said second one or more memory cells.

29. The system of claim 28, wherein said second supply voltage is equal to said third supply voltage.

30. The system of claim 20, wherein:
said one or more memory cells are a first one or more memory cells;
said system also comprises a second one or more memory cells powered via a third supply voltage generated by said power supply;
said first one or more memory cells hold a corresponding one or more bits of a data word having a first fault sensitivity coefficient; and
said second one or more memory cells hold a corresponding one or more bits of said data word having a second fault sensitivity coefficient.

31. The system of claim 30, wherein cell size of said first one or more memory cells is the same as cell size of said second one or more memory cells.

32. The system of claim 31, wherein said second supply voltage is higher than said third supply voltage.

33. The system of claim 30, wherein cell size of said first one or more memory cells is larger than cell size of said second one or more memory cells.

34. The system of claim 20, wherein:
said one or more memory cells are a first one or more memory cells;
said system also comprises a second one or more memory cells powered via a third supply voltage generated by said power supply; and
said second supply voltage is equal to said third supply voltage.

35. The system of claim 20, wherein said adjustment results in said second supply voltage being a first voltage when a first type of data is stored in said one or more memory cells and said second supply voltage being a second voltage when a second type of data is stored in said one or more memory cells.

36. The system of claim 20, wherein said second supply voltage is applied to a source node of one or more access transistors that provide power to said one or more memory cells.

37. A system comprising:
an electronic device comprising power supply, one or more memory cells, and digital circuitry other than said one or more memory cells, wherein:
said digital circuitry other than said one or more memory cells is powered via a first supply voltage generated by said power supply;

said one or more memory cells are powered via a second supply voltage generated by said power supply;
said power supply is operable to:
control said first supply voltage independent of said second supply voltage; and
adjust said second supply voltage based on a type of data stored in said one or more memory cells;
said adjustment results in said second supply voltage being a first voltage when a first type of data is stored in said one or more memory cells and said second supply voltage being a second voltage when a second type of data is stored in said one or more memory cells.

38. The system of claim 37, wherein a first type of said data adheres to a first communication standard and said second type of data adheres to a second communication standard.

39. The system of claim 37, wherein said first type of said data is of a first format and said second type of data is of a second format.

40. The system of claim 37, wherein said power supply is operable to adjust said second supply voltage based on a tolerable error rate for data stored in said one or more memory cells.

41. The system of claim 37, wherein:
said one or more memory cells are a first one or more memory cells;
said system also comprises a second one or more memory cells powered via a third supply voltage generated by said power supply; and
said power supply is operable to control said third supply voltage independent of said second supply voltage and independent of said first supply voltage.

42. The system of claim 37, wherein:
said one or more memory cells are a first one or more memory cells;
said system also comprises a second one or more memory cells powered via a third supply voltage generated by said power supply;
said first one or more memory cells hold a corresponding one or more most significant bits of a data word; and
said second one or more memory cells hold a corresponding one or more least significant bits of said data word.

43. The system of claim 42, wherein cell size of said first one or more memory cells is the same as cell size of said second one or more memory cells.

44. The system of claim 43, wherein said second supply voltage is higher than said third supply voltage.

45. The system of claim 42, wherein cell size of said first one or more memory cells is larger than cell size of said second one or more memory cells.

46. The system of claim 45, wherein said second supply voltage is equal to said third supply voltage.

47. The system of claim 37, wherein:
said one or more memory cells are a first one or more memory cells;
said system also comprises a second one or more memory cells powered via a third supply voltage generated by said power supply;
said first one or more memory cells hold a corresponding one or more bits of a data word having a first fault sensitivity coefficient; and
said second one or more memory cells hold a corresponding one or more bits of said data word having a second fault sensitivity coefficient.

48. The system of claim 47, wherein cell size of said first one or more memory cells is the same as cell size of said second one or more memory cells.

49. The system of claim 48, wherein said second supply voltage is higher than said third supply voltage.

50. The system of claim 47, wherein cell size of said first one or more memory cells is larger than cell size of said second one or more memory cells.

51. The system of claim 37, wherein:
said one or more memory cells are a first one or more memory cells;
said system also comprises a second one or more memory cells powered via a third supply voltage generated by said power supply; and
said second supply voltage is equal to said third supply voltage.

52. The system of claim 37, wherein:
each of said one or more memory cells comprises cross-coupled inverters; and
said first supply voltage is applied to source nodes of PMOS transistors of each one of said cross-coupled inverters.

53. The system of claim 37, wherein said second supply voltage is applied to a source node of one or more access transistors that provide power to said one or more memory cells.

54. A system comprising:
an electronic device comprising power supply, one or more memory cells, and digital circuitry other than said one or more memory cells, wherein:
said digital circuitry other than said one or more memory cells is powered via a first supply voltage generated by said power supply;
said one or more memory cells are powered via a second supply voltage generated by said power supply;
said power supply is operable to:
control said first supply voltage independent of said second supply voltage; and
adjust said second supply voltage based on a type of data stored in said one or more memory cells; and
said second supply voltage is applied to a source node of one or more access transistors that provide power to said one or more memory cells.

55. The system of claim 54, wherein a first type of said data adheres to a first communication standard and a second type of data adheres to a second communication standard.

56. The system of claim 54, wherein said first type of said data is of a first format and a second type of data is of a second format.

57. The system of claim 54, wherein said power supply is operable to adjust said second supply voltage based on a tolerable error rate for data stored in said one or more memory cells.

58. The system of claim 54, wherein:
said one or more memory cells are a first one or more memory cells;
said system also comprises a second one or more memory cells powered via a third supply voltage generated by said power supply; and
said power supply is operable to control said third supply voltage independent of said second supply voltage and independent of said first supply voltage.

59. The system of claim 54, wherein:
said one or more memory cells are a first one or more memory cells;

said system also comprises a second one or more memory cells powered via a third supply voltage generated by said power supply;
said first one or more memory cells hold a corresponding one or more most significant bits of a data word; and
said second one or more memory cells hold a corresponding one or more least significant bits of said data word.

60. The system of claim 59, wherein cell size of said first one or more memory cells is the same as cell size of said second one or more memory cells.

61. The system of claim 60, wherein said second supply voltage is higher than said third supply voltage.

62. The system of claim 59, wherein cell size of said first one or more memory cells is larger than cell size of said second one or more memory cells.

63. The system of claim 62, wherein said second supply voltage is equal to said third supply voltage.

64. The system of claim 54, wherein:
said one or more memory cells are a first one or more memory cells;
said system also comprises a second one or more memory cells powered via a third supply voltage generated by said power supply;
said first one or more memory cells hold a corresponding one or more bits of a data word having a first fault sensitivity coefficient; and
said second one or more memory cells hold a corresponding one or more bits of said data word having a second fault sensitivity coefficient.

65. The system of claim 64, wherein cell size of said first one or more memory cells is the same as cell size of said second one or more memory cells.

66. The system of claim 65, wherein said second supply voltage is higher than said third supply voltage.

67. The system of claim 64, wherein cell size of said first one or more memory cells is larger than cell size of said second one or more memory cells.

68. The system of claim 54, wherein:
said one or more memory cells are a first one or more memory cells;
said system also comprises a second one or more memory cells powered via a third supply voltage generated by said power supply; and
said second supply voltage is equal to said third supply voltage.

69. The system of claim 54, wherein:
each of said one or more memory cells comprises cross-coupled inverters; and
said first supply voltage is applied to source nodes of PMOS transistors of each one of said cross-coupled inverters.

70. A system comprising:
an electronic device comprising a power supply, one or more memory cells, and digital circuitry other than said one or more memory cells, wherein:
said digital circuitry other than said one or more memory cells is powered via a first supply voltage generated by said power supply;
said one or more memory cells are powered via a second supply voltage generated by said power supply;
said power supply is operable to:
control said first supply voltage independent of said second supply voltage; and
adjust said second supply voltage based on a type of data stored in said one or more memory cells;
each of said one or more memory cells comprises cross-coupled inverters;
said one or more memory cells are a first one or more memory cells;
said system also comprises a second one or more memory cells powered via a third supply voltage generated by said power supply; and
said power supply is operable to control said third supply voltage independent of said second supply voltage and independent of said first supply voltage.

71. A system comprising:
an electronic device comprising a power supply, one or more memory cells, and digital circuitry other than said one or more memory cells, wherein:
said digital circuitry other than said one or more memory cells is powered via a first supply voltage generated by said power supply;
said one or more memory cells are powered via a second supply voltage generated by said power supply;
said power supply is operable to:
control said first supply voltage independent of said second supply voltage; and
adjust said second supply voltage based on a type of data stored in said one or more memory cells;
each of said one or more memory cells comprises cross-coupled inverters;
said one or more memory cells are a first one or more memory cells;
said system also comprises a second one or more memory cells powered via a third supply voltage generated by said power supply;
said first one or more memory cells hold a corresponding one or more most significant bits of a data word; and said second one or more memory cells hold a corresponding one or more least significant bits of said data word.

72. The system of claim 71, wherein cell size of said first one or more memory cells is the same as cell size of said second one or more memory cells.

73. The system of claim 72, wherein said second supply voltage is higher than said third supply voltage.

74. The system of claim 71, wherein cell size of said first one or more memory cells is larger than cell size of said second one or more memory cells.

75. The system of claim 74, wherein said second supply voltage is equal to said third supply voltage.

76. A system comprising:
an electronic device comprising a power supply, one or more memory cells, and digital circuitry other than said one or more memory cells, wherein:
said digital circuitry other than said one or more memory cells is powered via a first supply voltage generated by said power supply;
said one or more memory cells are powered via a second supply voltage generated by said power supply;
said power supply is operable to:
control said first supply voltage independent of said second supply voltage; and
adjust said second supply voltage based on a type of data stored in said one or more memory cells;
each of said one or more memory cells comprises cross-coupled inverters;

said one or more memory cells are a first one or more memory cells;

said system also comprises a second one or more memory cells powered via a third supply voltage generated by said power supply;

said first one or more memory cells hold a corresponding one or more bits of a data word having a first fault sensitivity coefficient; and said second one or more memory cells hold a corresponding one or more bits of said data word having a second fault sensitivity coefficient.

77. The system of claim 76, wherein cell size of said first one or more memory cells is the same as cell size of said second one or more memory cells.

78. The system of claim 77, wherein said second supply voltage is higher than said third supply voltage.

79. The system of claim 76, wherein cell size of said first one or more memory cells is larger than cell size of said second one or more memory cells.

80. A system comprising:
an electronic device comprising a power supply, one or more memory cells, and digital circuitry other than said one or more memory cells, wherein:
said digital circuitry other than said one or more memory cells is powered via a first supply voltage generated by said power supply;
said one or more memory cells are powered via a second supply voltage generated by said power supply;
said power supply is operable to:
control said first supply voltage independent of said second supply voltage; and
adjust said second supply voltage based on a type of data stored in said one or more memory cells;
each of said one or more memory cells comprises cross-coupled inverters;
said one or more memory cells are a first one or more memory cells;
said system also comprises a second one or more memory cells powered via a third supply voltage generated by said power supply; and
said second supply voltage is equal to said third supply voltage.

81. A system comprising:
an electronic device comprising a power supply, one or more memory cells, and digital circuitry other than said one or more memory cells, wherein:
said digital circuitry other than said one or more memory cells is powered via a first supply voltage generated by said power supply;
said one or more memory cells are powered via a second supply voltage generated by said power supply;
said power supply is operable to:
control said first supply voltage independent of said second supply voltage; and
adjust said second supply voltage based on a type of data stored in said one or more memory cells;
each of said one or more memory cells comprises cross-coupled inverters; and
said adjustment results in said second supply voltage being a first voltage when a first type of data is stored in said one or more memory cells and said second supply voltage being a second voltage when a second type of data is stored in said one or more memory cells.

82. A system comprising:
an electronic device comprising a power supply, one or more memory cells, and digital circuitry other than said one or more memory cells, wherein:
said digital circuitry other than said one or more memory cells is powered via a first supply voltage generated by said power supply;
said one or more memory cells are powered via a second supply voltage generated by said power supply;
said power supply is operable to:
control said first supply voltage independent of said second supply voltage; and
adjust said second supply voltage based on a type of data stored in said one or more memory cells;
each of said one or more memory cells comprises cross-coupled inverters; and
said second supply voltage is applied to a source node of one or more access transistors that provide power to said one or more memory cells.

* * * * *